(12) United States Patent
Sato et al.

(10) Patent No.: US 7,144,819 B2
(45) Date of Patent: Dec. 5, 2006

(54) METHOD FOR MANUFACTURING A SEMICONDUCTOR DEVICE

(75) Inventors: Tomohiko Sato, Kanagawa (JP); Shigeharu Monoe, Kanagawa (JP); Shinya Sasagawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/954,340

(22) Filed: Oct. 1, 2004

(65) Prior Publication Data

US 2005/0118827 A1 Jun. 2, 2005

(30) Foreign Application Priority Data

Oct. 3, 2003 (JP) ............................. 2003-345457

(51) Int. Cl.
*H01L 21/311* (2006.01)
(52) U.S. Cl. .................... 438/700; 438/648; 438/656
(58) Field of Classification Search ............... 438/648, 438/656, 672, 700, 720
See application file for complete search history.

(56) References Cited

U.S. PATENT DOCUMENTS

| | | | |
|---|---|---|---|
| 5,453,406 A | 9/1995 | Chen | |
| 5,747,383 A * | 5/1998 | Chen et al. | 438/648 |
| 5,882,761 A | 3/1999 | Kawami et al. | |
| 6,538,390 B1 * | 3/2003 | Fujita et al. | 315/169.3 |
| 6,710,387 B1 * | 3/2004 | Nakamura | 257/296 |
| 2002/0113248 A1 | 8/2002 | Yamagata et al. | |
| 2003/0207594 A1 * | 11/2003 | Catabay et al. | 438/778 |
| 2005/0045891 A1 * | 3/2005 | Yamazaki et al. | 257/72 |

FOREIGN PATENT DOCUMENTS

| | | |
|---|---|---|
| JP | 08-330283 | 12/1996 |
| JP | 09-148066 | 6/1997 |
| JP | 11-111693 | 4/1999 |
| JP | 11-194499 | 7/1999 |
| JP | 11-271753 | 10/1999 |
| JP | 2000-058513 | 2/2000 |
| JP | 0 993 235 | 4/2000 |
| JP | 2001-110776 | 4/2001 |
| JP | 2001-203076 | 7/2001 |
| JP | 2002-313786 | 10/2002 |

OTHER PUBLICATIONS

Miyashita et al., "Full Color Displays Fabricated by Ink-Jet," Asia Display / IDW '01, pp. 1399-1402.

* cited by examiner

*Primary Examiner*—Phuc T. Dang
(74) *Attorney, Agent, or Firm*—Eric J. Robinson; Robinson Intellectual Property Law Offices, P.C.

(57) ABSTRACT

It is an object of the present invention to provide a method for manufacturing a highly reliable semiconductor device with preferable yield. In the invention, two-step etching is performed when selectively removing an interlayer insulating film with at least two layers constituting a semiconductor device, and forming an opening. One feature of the invention is that at least either one of a first gas (a first etching gas) and a second gas (a second etching gas) used at the time of the two-step etching is added with an inert gas.

35 Claims, 20 Drawing Sheets sealing portion | peripheral circuit portion | pixel portion

METHOD FOR MANUFACTURING A SEMICONDUCTOR DEVICE

BACKGROUND OF THE INVENTION

1. Field of Invention

The present invention relates to a semiconductor device having a circuit including a thin film transistor (hereinafter referred to as a TFT), and a method for manufacturing the same. For example, the invention relates to an electronic device which mounts a light emitting display device having a TFT and an organic light emitting element as its component.

In this specification, the term semiconductor device refers to a device in general that utilizes semiconductor characteristics to function, and a display device, an electro-optical device, a semiconductor circuit and an electronic device are all included in the semiconductor device.

2. Description of the Related Art

In recent years, the development for a liquid crystal display device and an Electro Luminescence display device in which a TFT is integrated on a glass substrate has been progressed. In each of these display devices, a thin film transistor is formed on a glass substrate using a thin film formation technique and a liquid crystal element or a light emitting element (electroluminescence element, hereinafter referred to as just an EL element) is formed on various circuits including the thin film transistor as a display element, thereby making it function as a display device.

The circuit including a TFT cause unevenness to some extent. Thus, when a liquid crystal element or an EL element is formed over the circuit, planarization using an organic resin film or the like is generally conducted (For example, Reference 1: Japanese Patent Laid-Open No. Hei 11-111693). Each pixel provided in a display portion of a semiconductor device has a pixel electrode therein. The pixel electrode is connected with the TFT through a contact hole provided in the above-mentioned organic resin film for planarization.

When an etching residue is left in the contact hole due to insufficient etching, there is a possibility that a wiring resistance is changed, or defective coverage is caused, thereby resulting in poor quality or characteristics when a wiring is formed.

A response to the above-mentioned insufficient etching is attempted (for example, Reference 1: Japanese Patent Laid-Open No. Hei 11-111693). In the Reference 1, a method for detecting a residue and removing the residue in the contact hole again after forming the contact hole, is disclosed.

However, a method described in the Reference 1, plural etching steps are required; therefore, productivity decreases due to increase in the steps. In addition, there is no effect of reducing a residue in the step itself since the etching step in itself is a conventional method.

BRIEF SUMMARY OF THE INVENTION

According to the present invention, an opening is formed by etching with preferable planarity by reducing an etching residue at the time of forming an opening such as a contact hole in a laminated structure constituting a semiconductor device. Hence, it is an object of the invention to provide a highly reliable semiconductor device and a method for manufacturing the same with good yield.

In the invention, an interlayer insulating film which is high in heat resistance, insulation and planarization rate is required as an interlayer insulating film provided for planarization. It is preferable to use application method typified by spin coat as a method for forming such an interlayer insulating film rather than CVD or vapor deposition.

Specifically, it is preferable to use a thermostability planarizing film obtained by application method as an interlayer insulating film and a partition. As a material of the interlayer insulating film and the partition, an application film in which a skeletal structure is configured by the bond of silicon (Si) and oxygen (O), and which has at least one kind of hydrogen, fluorine, an alkyl group or aromatic hydrocarbon as a substituent, is used. The film after baking can be referred to as a silicon oxide film containing the alkyl group. The silicon oxide (SiOx) film containing the alkyl group has higher light-transmittance than an acrylic resin and is capable of withstanding heat treatment of at least 300° C.

In the invention, a method for forming an interlayer insulating film and a partition by application method is as follows: thinner pre-wet treatment is performed to improve wettability after performing washing with purified water. Then, a liquid raw material called varnish in which a low molecular weight ingredient (a precursor) having the bond of silicon (Si) and oxygen (O) is dissolved into a solvent is applied over the substrate by spin coat or the like. Afterwards, a thin film can be obtained by conducting volatilization (evaporation) of the solvent and crosslinking reaction of the low molecular weight ingredients by heating the varnish along with the substrate. Then, an applied film on the periphery of an end of the substrate with the applied film formed thereon is removed. In the case of forming a partition, patterning may be performed to provide the partition with a desired shape. In addition, a film thickness is controlled by a spin rotation rate, rotation time, and the density and viscosity of the varnish.

A manufacturing cost can be reduced by using the same material for the interlayer insulating film and the partition. In addition, the cost can be reduced by using a common apparatus as a film formation applicator and an etching apparatus.

In the invention, two-step etching is performed when selectively removing an interlayer insulating film including at least two layers constituting a semiconductor device, and forming an opening. One feature of the invention is that at least one of a first gas (a first etching gas) and a second gas (a second etching gas) used at the time of the two-step etching is added with an inert gas. Naturally, an inert gas may be added to both the first gas and the second gas.

A substance added as an etching gas is not limited to an inert gas as long as it is a substance having an effect of cutting and etching a fibrous structure constituting an object to be processed. Therefore, a substance having a molecular structure may be also used.

One aspect of manufacturing method of a semiconductor device according to the invention is that a second interlayer insulating film is formed, a first interlayer insulating film is formed over the second interlayer insulating film, the first interlayer insulating film is selectively removed with the use of a first gas to form an opening which reaches the second interlayer insulating film, the second interlayer insulating film in the opening is selectively removed with the use of a second gas to form a contact hole, and Ar is added to at least one of the first gas and the second gas.

As the first gas and the second gas, one kind or plural kinds of inert gases of He, Ne, Ar, Kr and Xe can be used. More preferably, one kind or plural kinds of Ar, Kr and Xe can be used as the inert gas to be added 1. Above all, it is preferable to use argon since it has the comparatively large atomic radius and is inexpensive.

When an inert gas is added to the first gas, the inert gas may be added so that the flow thereof is to be 26% or more and 50% or less of the total flow. When an inert gas is added to the second gas, the inert gas may be added so that the flow thereof is to be 60% or more and 85% or less, more preferably, 65% or more and 85% or less of the total flow.

A semiconductor device according to the invention is a highly reliable semiconductor device manufactured by a method disclosed hereinafter. Another aspect of manufacturing method of a semiconductor device comprises the steps of: forming a thin film transistor having a semiconductor layer having a source region, a drain region and a channel forming region therebetween, a gate insulating film, and a gate electrode over a first substrate having an insulating surface; forming a thermostability planarizing film containing silicon oxide over an unevenness shape caused by the thin film transistor; selectively removing the thermostability planarizing film with the use of a first gas containing an inert gas; forming an opening over the source region or the drain region; and forming a contact hole which reaches the source region or the drain region by selectively removing the gate insulating film with the use of a second gas.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a first substrate having an insulating surface; forming a first insulating film over the thin film transistor; forming a thermostability planarizing film containing silicon oxide over an unevenness shape caused by the thin film transistor; forming a second insulating film on the thermostability planarizing film; selectively removing the first insulating film, the thermostability planarizing film and the second insulating film with the use of a first gas containing an inert gas; forming an opening over the source region or the drain region; and forming a contact hole which reaches the source region or the drain region by selectively removing the gate insulating film with the use of a second gas.

In the invention, when the thermostability planarizing film is selectively removed by etching, the first gas containing an inert gas is used as an etching gas. The inert gas may be added so that the flow thereof is to be 26% or more and 50% or less of the total flow. As the inert element to be added, one kind or plural kinds of Ar, Kr and Xe can be used. Above all, it is preferable to use argon which has comparatively large atomic radius and is inexpensive. Specifically, it is preferable to use a gas containing $CF_4$, $O_2$, He and Ar as an etching gas.

An opening formed by etching with the use of the first gas containing the inert gas generates less etching residue and high planarity. Hence, a contact hole which is formed later by etching the gate insulating film with the use of a gas containing $CHF_3$ or the like has also high planarity; therefore, the contact hole has a preferable form.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a first substrate having an insulating surface; forming a thermostability planarizing film containing silicon oxide over an unevenness shape caused by the thin film transistor; selectively removing the thermostability planarizing film with the use of a first gas, thereby forming an opening over the source region or the drain region; and forming a contact hole which reaches the source region or the drain region by selectively removing the gate insulating film with the use of a second gas containing an inert gas.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a first substrate having an insulating surface; forming a first insulating film over the thin film transistor; forming a thermostability planarizing film containing silicon oxide over an unevenness shape caused by the thin film transistor; forming a second insulating film on the thermostability planarizing film; selectively removing the first insulating film, the thermostability planarizing film and the second insulating film with the use of a first gas, thereby forming an opening over the source region or the drain region; and forming a contact hole which reaches the source region or the drain region by selectively removing the gate insulating film with the use of a second gas containing an inert gas.

In the invention, when the gate insulating film is selectively removed by etching, the second gas containing an inert gas is used as an etching gas. As the second gas, a gas in which the flow of an inert gas is added to be 60% or more and 85% or less, more preferably, 65% or more and 85% or less of the total flow, may be used. As the inert element to be added, one kind or plural kinds of Ar, Kr and Xe may be used. Above all, it is preferable to use argon, which has comparatively large atomic radius and is inexpensive. Specifically, it is preferable to use a gas containing $CHF_3$ and Ar.

The contact hole formed by etching with the use of the gas containing the inert gas generates little etching residue and unevenness due to a transcription of the etching residue; thereby having high planarity. A residue and the gate insulating film can be etched with preferable planarity according to the invention even if a residue occurs in the opening in etching the thermostability planarizing film previously. Therefore, a contact hole with high planarity and a preferable form can be formed.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a first substrate having an insulating surface; forming a thermostability planarizing film containing silicon oxide over an unevenness shape caused by the thin film transistor; selectively removing the thermostability planarizing film with the use of a first gas containing an inert gas, thereby forming an opening over the source region or the drain region; and forming a contact hole which reaches the source region or the drain region by selectively removing the gate insulating film with the use of a second gas containing an inert gas.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a first substrate having an insulating surface; forming a first insulating film over the thin film transistor; forming a thermostability planarizing film containing silicon oxide over an unevenness shape caused by the thin film transistor; forming a second insulating film on the thermostability planarizing film; selectively removing the first insulating film, the thermostability planarizing film and the second insulating film with the use of a first gas containing an inert gas; forming an opening over the source region or the drain region; and forming a contact hole which reaches the source region or the drain region by selectively removing the gate insulating film with the use of a second gas containing an inert gas.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a substrate having an insulating surface; forming a thermostability planarizing film containing silicon oxide over an unevenness shape caused by the thin film transistor; selectively removing the thermostability planarizing film with the use of a first gas containing He under the pressure of 25 Pa or less, thereby forming an opening over the source region or the drain region; and forming a contact hole which reaches the source region or the drain region by selectively removing the gate insulating film with the use of a second gas.

Another aspect of manufacturing method of a semiconductor device according to the invention comprises the steps of: forming a thin film transistor having a semiconductor layer having a source region, a drain region and a channel forming region therebetween, a gate insulating film, and a gate electrode over a substrate having an insulating surface; forming a first insulating film over the thin film transistor; forming a thermostability planarizing film containing silicon oxide is formed over an unevenness shape caused by the thin film transistor; forming a second insulating film on the thermostability planarizing film; selectively removing the first insulating film, the thermostability planarizing film and the second insulating film with the use of a first gas containing He under the pressure of 25 Pa or less; forming an opening over the source region or the drain region; and forming a contact hole which reaches the source region or the drain region by selectively removing the gate insulating film with the use of a second gas.

In the invention, when the thermostability planarizing film is selectively removed by etching, the first gas containing an inert gas is used as an etching gas. The inert gas is added so that the flow of the inert gas is to be at least 26% and at most 50% of the total flow of the first inert gas used for etching. In addition, when the gate insulating film is selectively removed by etching, the second gas containing an inert gas may be also used as an etching gas. The inert gas is added so that the flow of the inert gas is to be at least 60% and at most 85%, more preferably, at least 65% and at most 85% of the total flow of the second inert gas used for etching. As the inert gas, one kind or plural kinds of Ar, Kr and Xe are used. Above all, it is preferable to use Ar (argon) which has comparatively large atomic radius and is inexpensive. Specifically, it is preferable to use an inert gas containing $CE_4$, $O_2$, He and Ar.

An opening formed by etching with the use of the gas containing the inert gas according to the invention generates little etching residue and high planarity. Therefore, a contact hole with high planarity and a preferable shape can be formed.

As for a manufacturing method of a semiconductor device according to the invention, a first insulating film covering a thin film transistor may be formed to protect the thin film transistor. A second insulating film may be also formed on a thermostability planarizing film. The second insulating film may be also used as an etching stopper in patterning a wiring formed thereon. When the selective ratio between the first insulating film, the thermostability planarizing film and the second insulating film, and the gate insulating film is high in the etching step, the gate insulating film can be used as an etching stopper.

Therefore, nitride films can be used for the first insulating film and the second insulating film, and an oxide film can be used for the gate insulating film. Specifically, a silicon nitride (SiN) film, a silicon nitride oxide (SiNO) film which contains more nitrogen than oxygen, or the like can be used for a nitride film. Silicon oxide ($SiO_2$) film and a silicon oxynitride (SiON) film which contains more oxygen than nitrogen can be used for an oxide film.

In each of the above-mentioned structure, the semiconductor device is applicable to both an active matrix type and a passive matrix type.

A light emitting element (an EL element) which is a display element has a layer containing an organic compound from which luminescence (Electro Luminescence) can be obtained by electric field application (hereinafter referred to as an EL layer), an anode and a cathode. Luminescence in an organic compound includes luminescence (fluorescence) in returning from a singlet excited state to the ground state, and luminescence (phosphorescence) in returning from a triplet exited state to the ground state. The semiconductor device manufactured according to the invention is applicable with either fluorescence or phosphorescence.

An EL layer is sandwiched between a pair of electrodes in a light emitting element having an EL layer (an EL element), and generally has a laminated structure. A laminated structure of "a hole transporting layer/a light emitting layer/an electron transporting layer" can be given as a typical structure. This structure brings extremely high luminous efficiency, so that most of the light emitting devices developed nowadays employs this structure.

Further, structures having the following layers sequentially laminated over an anode are also applicable: a hole injecting layer/a hole transporting layer/a light emitting layer/an electron transporting layer, and a hole injecting layer/a hole transporting layer/a light emitting layer/an electron transporting layer/an electron injecting layer. Fluorescent pigments or the like may be also doped into the light emitting layer. Furthermore, all of layers may be formed of either low molecular weight materials or high molecular weight materials. Alternatively, a layer containing an inorganic material may be used. Note that, in this specification, all the layers provided between an electrode which serves as a cathode and an electrode which serves as an anode are referred to as an EL layer generically. Accordingly, the above layers: a hole injecting layer, a hole transporting layer, a light emitting layer, an electron transporting layer, and an electron injecting layer are all included in an EL layer.

In the light emitting device of the invention, a method for driving screen display is not specifically limited, and a dot sequential drive system, a line sequential drive system, a plane sequential drive system, or the like may be employed. Typically, the line sequential drive system is employed, and a time division gradation drive system or an area gradation drive system may be utilized as needed. The video signal to be inputted into a source line of the light emitting device may either an analogue signal or a digital signal, and the drive circuit may be designed corresponding to the video signal as needed.

Further, in a semiconductor device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC).

In the specification, light-extraction efficiency refers to a ratio of light discharged to the atmosphere from the front of a transparent substrate of an element to that emitted from the element.

The invention is applicable regardless of a TFT structure. For example, the invention is applicable to a top gate type TFT, a bottom gate type (inversed stagger type) TFT, or a forward stagger type TFT.

As an active layer of the TFT, an amorphous semiconductor film, a semiconductor film containing a crystal structure, a semiconductor compound film containing an amorphous structure can be appropriately used. Further, a semi-amorphous semiconductor film which is semiconductor having an intermediate structure of an amorphous structure and a crystal structure (including single crystal and poly-crystal), and a tertiary state which is stable as a case of free energy, and including a crystalline region having a short distance order and lattice distortion (also referred to as a microcrystal semiconductor film) can be used as the active layer of the TFT. In the semi-amorphous semiconductor film, a crystal grain having a grain diameter of from 0.5 nm to 20 nm is included in at least one region of the film, and the Raman spectrum, the peak specific to silicon shifts to the lower side of wave number of 520 cm$^{-1}$. In addition, in the semi-amorphous semiconductor film, a diffraction peak of (111) and (220) derived from a Si crystal lattice is observed in x-ray diffraction. The semi-amorphous semiconductor film includes hydrogen or halogen at least 1 atom % as a neutralizer of an uncombined hand (a dangling bond). The semi-amorphous semiconductor film is manufactured by performing glow discharging decomposition (plasma CVD) of a silicide gas. As the silicide gas, $SiH_4$, additionally, $Si_2H_6$, $SiH_2Cl_2$, $SiHCl_3$, $SiCl_4$, $SiF_4$, or the like can de used. The silicide gas may be diluted with $H_2$, or $H_2$ and one or more of rare gas elements: He, Ar, Kr, and Ne. Dilution ratio is within the range from 2 times to 1000 times. Pressure is roughly within the range from 0.1 Pa to 133 Pa; power frequency, from 1 MHz to 120 MHz, preferably from 13 MHz to 60 MH; and substrate heating temperature, at most 300° C., preferably from 100° C. to 250° C. An atmospheric constitution impurity such as oxygen, nitrogen or carbon as an impurity element within a film is preferably $1 \times 10^{20}$ atoms/cm$^3$ or less, in particular, the oxygen concentration is $5 \times 10^{19}$ atoms/cm$^3$ or less, preferably, $1 \times 10^{19}$ atoms/cm$^3$ or less. Note that electric field-effect mobility μ of a TFT in using a semi-amorphous film as an active layer is from 1 cm$^2$/Vsec to 10 cm$^2$/Vsec.

According to the invention, an etching residue is reduced to form a contact hole and an opening with preferable planarity and a preferable shape. Hence, a defectiveness such as short circuit of a wiring and the like can be prevented. Therefore, a semiconductor device can be manufactured with good yield leading to providing a highly reliable semiconductor device.

According to the invention, an etching residue is reduced and an opening is etched with preferable planarity at the time of forming an opening such as a contact hole in a laminated structure constituting a semiconductor device. Hence, the invention can provide a highly reliable semiconductor device, and a method for manufacturing the semiconductor device with good yield.

In a semiconductor device in which a layer containing an organic compound is a light emitting layer, an interlayer insulating film having little amount of dehydration and degasification can be provided; thereby enabling to enhance reliability of the semiconductor device.

DETAILED DESCRIPTION OF THE INVENTION

Embodiment Mode

An embodiment mode of the present invention is described hereinafter.

Figure 1A:
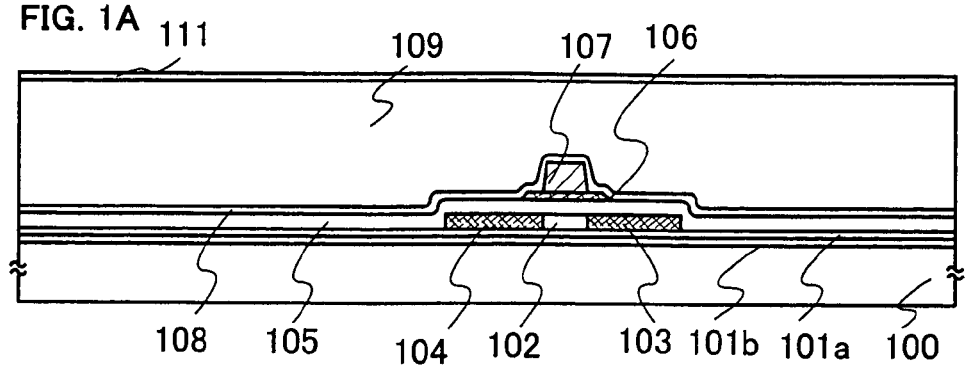
FIGS. 1A to 1D show structures of the invention.

In FIG. 1A, a silicon nitride oxide film 101b is formed with a film thickness of from 10 nm to 200 nm (preferably from 50 nm to 100 nm) by plasma CVD as a base film 101 over a substrate 100 having an insulating surface. Then a silicon oxynitride film 101a is laminated with a film thickness of from 50 nm to 200 nm (preferably from 100 nm to 150 nm). As the substrate 100, a substrate in which an insulating film is formed over a surface of a glass substrate, a quartz substrate, a silicon substrate, a metal substrate or a stainless substrate having an insulating film over the surface thereof may be used. Alternatively, a plastic substrate having heat resistance which can withstand a treatment temperature of this embodiment mode, or a flexible substrate may be used. Further, a two-layer structure and a structure where a single layer or two or more layers of base (insulating) films are laminated may be also used as a base film.

Next, a semiconductor film is formed over the base film. The semiconductor film may be formed with a film thickness of from 25 nm to 200 nm (preferably from 30 nm to 200 nm) by a known method (sputtering, LPCVD, plasma CVD or the like). Although a material of the semiconductor film is not limited, the semiconductor film is preferably formed from silicon, a germanium-silicon (SiGe) alloy or the like.

An amorphous semiconductor (typically, hydrogenated amorphous silicon) and a crystalline semiconductor (typically, polysilicon) may be used as a material of the semiconductor film. In addition, a semiconductor compound film having an amorphous structure such as an amorphous silicon germanium film or amorphous silicon carbide film may be applied. The polysilicon includes a so-called high temperature polysilicon mainly containing polycrystalline silicon formed through a process temperature of 800° C. or more, a so-called low temperature polysilicon mainly containing polycrystalline silicon formed through a process temperature of 600° C. or less, crystalline silicon in which an element improving crystallization is added and crystallized, or the like.

As other material, a semi-amorphous semiconductor or a semiconductor containing a crystal phase in a part of the semi-amorphous semiconductor can be also used. A semi-amorphous semiconductor is a semiconductor having an intermediate structure of an amorphous structure and a crystal structure (including single crystal and polycrystal), and a tertiary state which is stable as a case of free energy and crystalline having a short distance order and lattice distortion. Typically, a semi-amorphous semiconductor is a semiconductor film in which silicon is mainly contained, lattice distortion is involved, and the Raman spectrum, the peak specific to silicon shifts to the lower side of wave number of 520 cm$^{-1}$. In addition, a semi-amorphous semiconductor film includes hydrogen or halogen of at least 1 atom % as a neutralizer of an uncombined hand (a dangling bond). Here, such a semiconductor is referred to as a semi-amorphous semiconductor (hereinafter referred to as an SAS). The SAS is also referred to as a so-called microcrystal semiconductor (typically, microcrystal silicon).

The SAS can be obtained by performing glow discharging decomposition of a silicide gas. As a typical silicide gas, $SiH_4$, additionally, $Si_2H_6$, $SiH_2Cl_2$, $SiHCl_3$, $SiCl_4$, $SiF_4$ or the like can be used. The formation of an SAS can be made easier by using the silicide gas which is diluted with hydrogen, or hydrogen and one or more of rare gas elements: helium, argon, krypton and neon. Preferably, the dilution ratio of hydrogen to the silicide gas is, for example, from 5 times to 1000 times in flow ratio. Naturally, the formation of the SAS by glow discharging decomposition is preferably performed under reduced pressure. However, the SAS can be also formed by using discharge under the atmospheric pressure. Typically, the formation may be performed within the pressure range of from 0.1 Pa to 133 Pa. Power frequency for forming glow discharging is from 1 MHz to 120 MHz, preferably from 13 Mhz to 60 Mhz. High-frequency voltage may be set appropriately. The temperature for heating the substrate is preferably 300° C. or less and the SAS can be formed at the substrate heating temperatures of from 100° C. to 200° C. Here, as an impurity element which is taken mainly at the time of formation, an impurity coming from an atmospheric constituent such as oxygen, nitrogen and carbon is desirably $1\times10^{20}$ atoms/cm$^3$ or less. In particular, the oxygen concentration is preferably made to have $5\times10^{19}$ atoms/cm$^3$ or less, more preferably $1\times10^{19}$ atoms/cm$^3$ or less. A favorable SAS can be obtained by further promoting lattice distortion by adding a rare gas element such as helium, argon, krypton and neon to enhance stability.

When a crystalline semiconductor film is used for the semiconductor film, the crystalline semiconductor film may be manufactured by a known method (laser crystallization, thermal crystallization, thermal crystallization using an element such as nickel which promotes crystallization, and the like). In the case of not introducing an element which promotes crystallization, hydrogen is emitted to make the hydrogen concentration in the amorphous silicon film $1\times10^{20}$ atoms/cm$^3$ or less by heating the amorphous silicon film for 1 hour under the nitrogen atmosphere at 500° C. before irradiating the amorphous silicon film with laser light. This is because the amorphous silicon film is destroyed when the film containing a large amount of hydrogen is irradiated with laser light.

A method for introducing a metal element to the amorphous semiconductor film is not limited as long as it is a method for making the metal element exist on a surface of the amorphous semiconductor film or therein. For example, sputtering, CVD, plasma treatment (including plasma CVD), absorption method, or a method of applying a solution of metal salt can be used. Among these, a method of using a solution is easy and advantageous in view of being easy to adjust the concentration of the metal element. It is desirable to form an oxide film by UV light irradiation under oxygen atmosphere, a thermal oxidation method, treatment by using ozone water containing hydroxyl radical or using hydrogen peroxide, or the like to improve wettability of a surface of the amorphous semiconductor film to diffuse a water solution on the entire surface of the amorphous semiconductor film.

Crystallization by thermal treatment and laser light irradiation may be combined, or thermal treatment or laser light irradiation may be separately performed plural times to crystallize the amorphous semiconductor film. When crystallization is performed by two steps of thermal treatment and laser light irradiation, the thermal treatment is performed for from 4 hours to 20 hours at a temperature of from 500° C. to 550° C. after introducing the metal element to crystallize the amorphous semiconductor film (hereinafter referred to as a first crystalline semiconductor film).

Crystallization is then enhanced by irradiating the first crystalline silicon film with laser light to obtain a second crystalline semiconductor film. In the laser crystallization method, a semiconductor film is irradiated with laser light. The laser to be used is preferably a solid laser, a gas laser, or a metal laser with pulsed or continuous oscillation. Examples of a solid laser include, a YAG laser, a $YVO_4$ laser, a YLF laser, a $YAlO_3$ laser, a glass laser, a ruby laser, an alexandrite laser, and a Ti: sapphire laser and the like. Examples of a gas laser include an excimer laser, an Ar laser, a Kr laser, and a $CO_2$ laser and the like, and examples of a metal laser include a helium-cadmium laser, a copper vapor laser, and a gold vapor laser. The laser beam can be converted into higher harmonics with a nonlinear optical element. In terms of conversion efficiency, excellent results are obtained when, for example, crystals called LBO, BBO, KDP, KTP, KB5, or CLBO is used for the nonlinear optical element. The conversion efficiency can be remarkably increased when those nonlinear optical elements are placed into a laser resonator. In higher harmonics lasers, Nd, Yb, Cr, or the like is generally doped, and laser is oscillated when it is excited. The dopant type may be appropriately selected by a practitioner.

Doping of a small amount of an impurity element (boron or phosphorus) may be performed to control a threshold voltage of a TFT in the crystalline semiconductor film obtained in this way.

A first photomask is manufactured to form a semiconductor layer 102 by patterning treatment using a photolithography method.

A gate insulating film 105 covering the semiconductor layer 102 is formed. The gate insulating film 105 is formed of an insulating film containing silicon with a thickness of from 40 nm to 150 nm by using plasma CVD or sputtering. Silicon oxide, silicon nitride, silicon oxynitride or silicon nitride oxide and the like can be used for the gate insulating film. Obviously, other insulating films can be used in a monolayer or a laminated structure.

In addition, a silicon oxynitride (SiON) film which contains Si of from 25 atomic % to 35 atomic %, oxygen of from 55 atomic % to 65 atomic %, nitrogen of from 1 atomic % to 20 atomic %, and hydrogen of from 0.1 atomic % to 10 atomic % is shown in the invention. In addition, a silicon nitride oxide (SiNO) film which contains Si of from 25 atomic % to 35 atomic %, oxygen of from 15 atomic % to 30 atomic %, nitrogen of from 20 atomic % to 35 atomic %, and hydrogen of from 15 atomic % to 25 atomic % is shown.

Next, a first conductive film having a film thickness of from 20 nm to 100 nm and a second conductive film having a film thickness of from 100 nm to 400 nm used as a gate electrode are laminated on the gate insulating film 105. The first conductive film and the second conductive film each may be formed of a film containing an element of Ta, W, Ti, Mo, Al, and Cu, an alloy material or a compound material mainly containing the element. In addition, a semiconductor film typified by a polycrystalline silicon film doped with an impurity element such as phosphorus, or an AgPdCu alloy may be used for the first conductive film and the second conductive film. Further, the invention is not limited to a two-layer structure. A three-layer structure may be used in which, for example, a tungsten film having a film thickness of 50 nm, an aluminum-silicon alloy (Al—Si) film having a film thickness of 500 nm, a titanium nitride film having a film thickness of 30 nm are sequentially laminated. When the three-layer structure is used, tungsten nitride may be used instead of tungsten of the first conductive film, an aluminum-titanium alloy (Al—Ti) film may be used instead of the aluminum-silicon alloy film (Al—Si) of the second conductive film, and a titanium film may be used instead of the titanium nitride film of the third conductive film. A single layer structure may be also used.

Then, a second photomask formed from a resist is manufactured by using photolithography to perform first etching treatment to form an electrode and a wiring. The first conductive film and the second conductive film can be etched to have a desired tapered shape by appropriately adjusting an etching condition (electric energy applied to a coil-shaped electrode, electric power applied to an electrode on a substrate side, electrode temperature on a substrate side and the like) by using an ICP (Inductively Coupled Plasma) etching. As an etching gas, a chlorine-based gas typified by $Cl_2$, $BCl_3$, $SiCl_4$, $CCl_4$ or the like, a fluorine-based gas typified by $CF_4$, $SF_6$, $NF_3$ or the like, or $O_2$ can be appropriately used.

A conductive layer (a first conductive layer and a second conductive layer) with a first shape including the first conductive layer and the second conductive layer is formed by the first etching treatment.

Then, a second etching treatment is performed without removing a mask formed from a resist. Here, a W film is selectively etched. At this time, the second conductive layer is formed by the second etching treatment. On the other hand, most of the first conductive layer is not etched and forms a second shape conductive layer. Hence, a conductive film 106 and a conductive film 107 are formed. In this embodiment mode, the conductive layer is formed by dry etching. However, the conductive layer may be also formed by wet etching.

Next, a resist mask is newly formed by using a third photomask after removing the resist mask. A first doping step is performed to dope an impurity element which imparts n-type conductivity (typically phosphorus (P) or arsenic (As)) to a semiconductor at the low concentration to form an n-channel TFT not shown here. The resist mask covers a region which is to be a p-channel TFT and a region adjacent to the conductive layer. A low concentration impurity region is formed by performing through doping via the insulating film by the first doping step. A plurality of TFTs are used to drive one light emitting element. However, the above-mentioned doping step is not necessary when the light emitting element is driven only by a p-channel TFT.

Then, a resist mask is newly formed by using a fourth photomask after removing the resist mask. A second doping step is performed to dope an impurity element which imparts p-type conductivity (typically, boron (B)) to a semiconductor at the high concentration. P-type high concentration impurity regions 103 and 104 are formed by performing through doping via the gate insulating film 105 by the second doping step.

Then, a resist mask is newly formed by using a fifth photomask. A third doping step is performed to dope an impurity element which imparts n-type conductivity (typically, phosphorus or arsenic) to a semiconductor at the high concentration to form an n-channel TFT not shown here. Ion doping in the third doping step is performed under the condition that the amount of doze is set at from $1\times10^{13}$ atoms/cm$^2$ to $5\times10^{15}$ atoms/cm$^2$; and the acceleration voltage, from 60 kV to 100 kV. The resist mask covers a region to be a p-channel TFT and a region adjacent to the conductive layer. An n-type high concentration impurity region is formed by performing through doping via the gate insulating film 105 by the third doping step.

To the above-mentioned steps, the impurity region is formed in each semiconductor layer.

Subsequently, an insulating film 108 containing hydrogen is formed as a passivation film after removing the mask formed from a resist. The insulating film 108 is formed of an insulating film containing silicon with a thickness of from 100 nm to 200 nm by using plasma CVD or sputtering. The insulating film 108 is not limited to a silicon nitride film. The insulating film 108 may be a silicon nitride oxide (SiNO) film using plasma CVD and other insulating films containing silicon may be also used in a monolayer or a laminated structure.

Furthermore, a step of hydrogenating the semiconductor layer is performed by a heat treatment for from 1 hour to 12 hours at a temperature from 300° C. to 550° C. under the nitrogen atmosphere. Preferably, the step is performed at a temperature from 400° C. to 500° C. The step is a step which terminates dangling bond of the semiconductor layer with hydrogen contained in the insulating film 108.

The insulating film 108 may be formed of a material selected from silicon nitride, silicon oxide, silicon oxynitride (SiON), silicon nitride oxide (SiNO), aluminum nitride (AlN), aluminum oxynitride (AlON), aluminum nitride oxide (AlNO), which has more nitrogen content than oxygen content, or aluminum oxide, diamond like carbon (DLC), and a nitrogen-containing carbon (CN). A material in which a skeletal structure is configured by the bond of silicon (Si) and oxygen (O) and at least hydrogen is contained as a substituent, or a material having at least one kind of fluorine, an alkyl group or an aromatic hydrocarbon as a substituent (typically, siloxane system polymer) may be also used.

Heat treatment, intense light irradiation, or laser light irradiation may be performed to activate the impurity element. Plasma damage to the gate insulating film and plasma damage to an interface between the gate insulating film and the semiconductor layer can be recovered at the same time of the activation.

A thermostability planarizing film 109 which serves as an interlayer insulating film is then formed. As the thermostability planarizing film 109, an insulating film in which a skeletal structure is configured by the bond of silicon (Si) and oxygen (O) obtained by application method, is used.

Here, a formation procedure of the thermostability planarizing film 109 is described in detail with reference to FIGS. 13A to 13C.

First, a pure water washing is performed on a substrate to be processed. Megasonic washing may be also performed on the substrate to be processed. Next, after performing dehydrobaking for 110 seconds at 140° C., a temperature of the substrate is regulated by cooling for 120 seconds with a water-cooled plate. Next, the substrate is transferred to and placed in a spin applying apparatus shown in FIG. 13A.

Figure 13A:
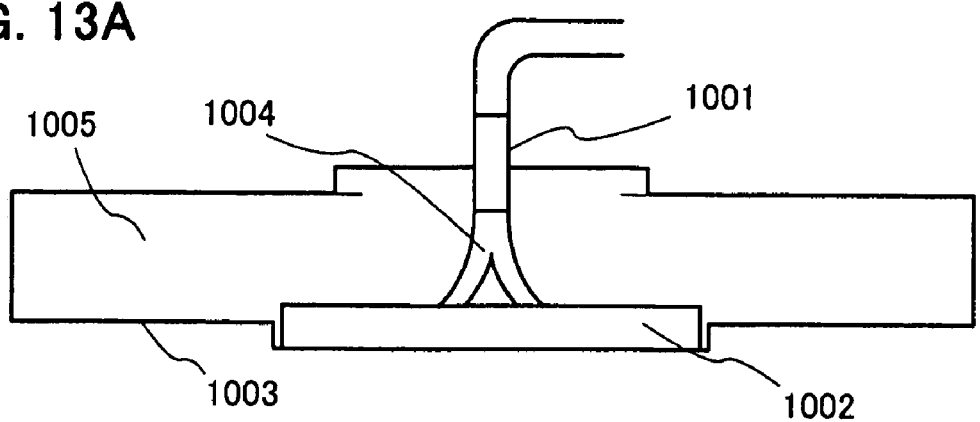
FIGS. 13A to 13C show an application apparatus and an edge remover.
Figure 13B:
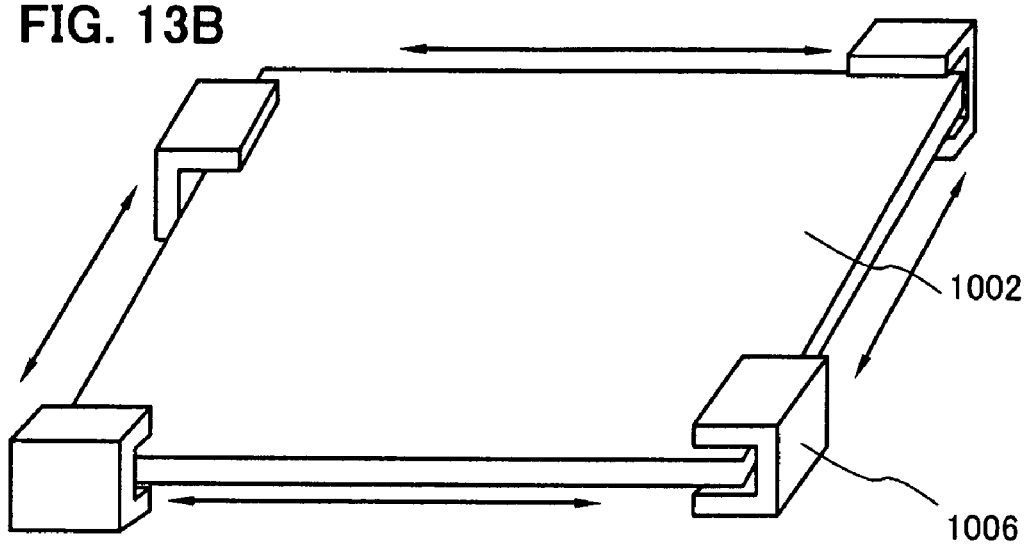
Figure 13C:
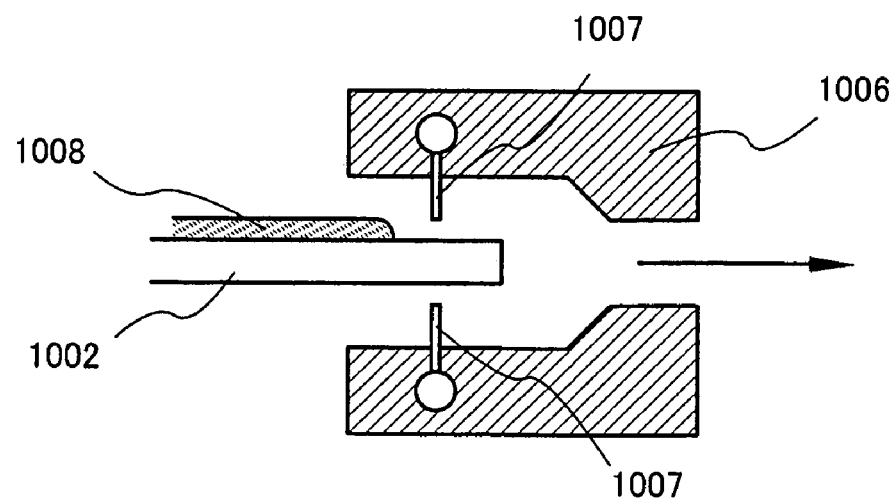

FIG. 13A shows a sectional schematic diagram of the spinning applying apparatus. In FIG. 13A, reference numeral 1001 denotes a nozzle; 1002, a substrate; 1003, an application cup; and 1004, an application material solution. The spinning applying apparatus has a mechanism in which the solution of a material to be applied is dropped from the nozzle 1001, and the substrate 1002 is placed horizontally in the application cup 1003 and the entire application cup rotates. The spinning applying apparatus also has a mechanism in which the pressure of atmosphere in the application cup 1003 can be controlled.

Next, pre-wet application is performed to improve wettability with the use of an organic solvent such as thinner (a volatile mixture solvent formed by mixing aromatic hydrocarbon (toluene or the like), alcohols, ester acetate or the like). Thinner is thrown off by spinning the substrate with high speed (rotation rate, 450 rpm), after spreading the thinner thoroughly with centrifugal force by spinning the substrate (rotation rate, 100 rpm) as dropping 70 ml of the thinner.

Subsequently, the solution of the material to be applied which is prepared by dissolving siloxane system polymer in a solvent (propylene glycolmonomethyl ether) is thoroughly spread by centrifugal force with gradually spinning (rotation rate from 0 rpm to 1000 rpm) the substrate and dropping the solution of the material to be applied from the nozzle 1001. The application material solution can be classified into, for example, alkyl siloxane polymer, alkyl silsesquioxane polymer, hydrogenated silsesquioxane polymer, hydrogenated alkyl silsesquioxane polymer and the like according to a structure of siloxane. As an example of siloxane system polymer, an application insulating film material, production name: PSB-K1, PSB-K31 manufactured by Toray Industries, Inc., or an application insulating film material, production name: ZRS-5PH manufactured by Catalysts & Chemicals Industries Co., Ltd. can be given. Then, the substrate is gradually spun (rotation rate from 0 rpm to 1400 rpm) after holding the substrate for 30 seconds for leveling a film formed by the application step.

Inside of the application cup 1003 is exhausted to be decompressed, then reduced-pressure drying is performed for within 1 minute.

Edge removing treatment is performed by an edge remover equipped in the spinning applying apparatus shown in FIG. 13A. An edge remover 1006 equipped with a moving means which moves in parallel along the periphery of the substrate 1002 is shown in FIG. 13B. In the edge remover 1006, a thinner discharging nozzle 1007 as in FIG. 13C is provided to sandwich one side of the substrate, and a circumference of the application film 1008 is dissolved by the thinner. Thereby removing the film 1008 formed by the application step in the circumference of the substrate edge face by exhausting liquid and gas in the arrow direction shown in the figure.

Then, prebaking is performed by conducting baking for 170 seconds at 110° C.

The substrate is transferred from the spinning applying apparatus and cooled. Then, baking is further performed for 1 hour at 270° C. The thermostability planarizing film with a film thickness of 0.8 μm is formed in this way. When smoothness of the obtained thermostability planarizing film is measured with an AFM (atomic force microscope), the P-V value (Peak to Valley: difference between maximum value and minimum value of height) in a range of 10 μm×10 μm is about 5 nm, and Ra (surface average roughness) is about 0.3 nm.

Transmittance can be changed by changing a burning temperature of the thermostability planarizing film 109. When transmittance and refractive index in the thermostability planarizing film (an SiOx film containing an alkyl group) with a film thickness of 0.8 μm are measured under burning temperature conditions (270° C., 410° C.), transmittance is improved at a burning temperature of 410° C. compared with 270° C. Refractive index decreases at a burning temperature of 410° C.

In this way, the thermostability planarizing film 109 is formed.

The thermostability planarizing film 109 may be also formed by a droplet spraying method (an ink-jet method). When a droplet spraying method (an ink-jet method) is used, a material solution can be saved.

As the thermostability planarizing film 109, in addition to an insulating film in which a skeletal structure is configured by the bond of silicon (Si) and oxygen (O), a film including one kind or plural kinds of an inorganic material (silicon oxide, silicon nitride, silicon oxynitride, silicon nitride oxide or the like), an organic material (an organic resin material) of photosensitive or non-photosensitive (polyimide, acrylic, polyamide, polyimidamide, resist, benzocyclobutene, or the like), or a lamination layer of these films can be used as long as the materials have high heat resistance and planarity.

An insulating film 111 is then formed as a passivation film (see FIG. 1A). The insulating film 111 is formed of an insulating film containing silicon with a thickness of from 100 nm to 200 nm by using plasma CVD or sputtering. The insulating film 111 is provided as an etching stopper film to protect the thermostability planarizing film 109 which is an interlayer insulating film when a wiring (also used as a drain electrode or a source electrode) 116 is patterned in a later step.

Obviously, the insulating film 111 is not limited to a silicon oxynitride film, and other insulating films containing silicon may be used in a monolayer or a laminated structure.

In this embodiment mode, although the silicon nitride film formed by sputtering is used, a silicon nitride oxide (SiNO) film formed by plasma CVD may be also used. In this embodiment mode, the silicon nitride film may contain Ar and the concentration of Ar in the silicon nitride film is about from $5\times10^{18}$ atoms/cm$^3$ to $5\times10^{20}$ atoms/cm$^3$.

The insulating film 111 may be formed from a material selected from silicon nitride, silicon oxide, silicon oxynitride (SiON), silicon nitride oxide (SiNO), aluminum nitride (AlN), aluminum oxynitride (AlON), aluminum nitride oxide which has more nitrogen content than oxygen content (AlNO), aluminum oxide, diamond like carbon (DLC), and a nitrogen-containing carbon (CN). A material in which a skeletal structure is configured by the bond of silicon (Si) and oxygen (O) and at least hydrogen is contained as a substituent, or a material having at least one kind of fluorine, an alkyl group or aromatic hydrocarbon as a substituent may be also used.

Figure 1B:
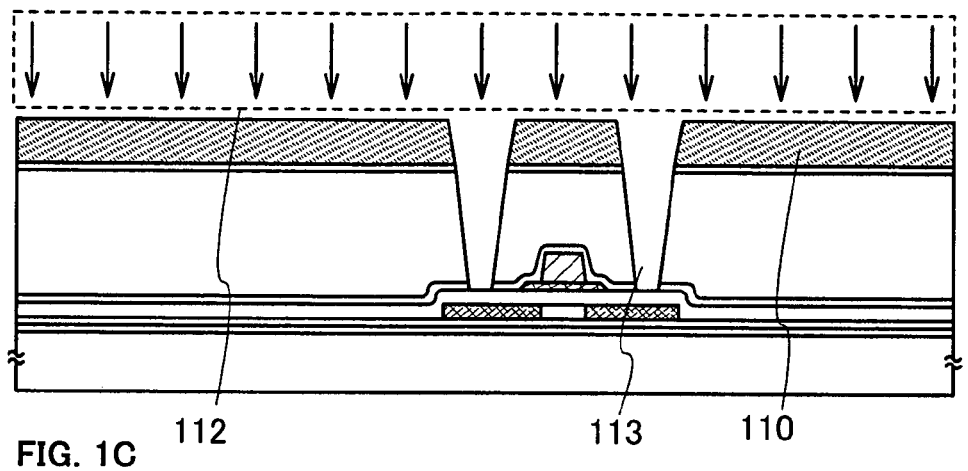

The thermostability planarizing film at a peripheral region is removed at the same time of forming a contact hole (an opening) in the thermostability planarizing film 109 with the use of a mask 110 formed from a resist. In this embodiment mode, the insulating film 111 which is a passivation film and the insulating film 108 are formed above and below the thermostability planarizing film 109 so as to sandwich the thermostability planarizing film 109, and the gate insulating film 105 is formed thereunder. In this embodiment mode, two-step etching of a nitrogen film mainly containing nitrogen and an oxide film mainly containing oxygen is shown. However, the invention is not limited thereto. In this embodiment mode, the nitrogen film mainly containing nitrogen is used for the insulating film 111 and the insulating film 108, and the film mainly containing oxygen is used for the gate insulating film 105. Therefore, the insulating film 111, the thermostability planarizing film 109 and the insulating film 108 are simultaneously etched by an etching gas 112 to form an opening 113 (see FIG. 1B).

In this embodiment mode, etching (wet etching or dry etching) is performed under the condition where selective ratio can be obtained with respect to the gate insulating film 105. An inert gas is added to an etching gas to be used. As an inert element to be added, one kind or plural kinds of He, Ne, Ar, Kr and Xe can be used. In the invention, one kind or plural kinds of Ar, Kr and Xe which have comparatively large atomic radius among inert elements may be added with 26% or more and 50% or less of the total flow. Above all, it is preferable to use argon since it has the comparatively large atomic radius and is inexpensive. In this embodiment mode, $CF_4$, $O_2$, He and Ar may be used as the etching gas 112. When dry etching is performed, the etching may be performed under the condition: flow of $CF_4$ is set at 380 sccm; $O_2$, 290 sccm; He, 500 sccm; Ar, 500 sccm; RF power, 3000 W; and pressure, 25 Pa. As a chamber of an etching apparatus of this embodiment mode, an apparatus with volume of about 0.335 m$^3$ may be used. An etching residue can be decreased according to the above conditions.

In the case of existing an etching residue in the contact hole due to insufficient etching, there is a possibility that a wiring resistance is changed, or defective coverage is caused, thereby resulting in poor quality or characteristics when a wiring is formed. According to the invention, an etching residue is decreased and an opening is formed with etching with preferable planarity at the time of forming the opening such as a contact hole in a laminated structure constituting a semiconductor device. Hence, the invention can provide a highly reliable semiconductor device, and a method for manufacturing the semiconductor device with good yield.

In addition, overetching may be performed by increasing the etching time at the rate of about from 10% to 20% in order to perform etching without leaving any residue on the gate insulating film 105. A tapered shape may be formed by performing etching once or plural times. In order to form the tapered shape, a second dry etching is performed by further setting flow of $CF_4$ at 550 sccm; flow of $O_2$, 450 sccm; flow of He, 350 sccm; RF power, 3000 W; and pressure, 25 Pa with the use of $CF_4$, $O_2$, and He.

Figure 1C:
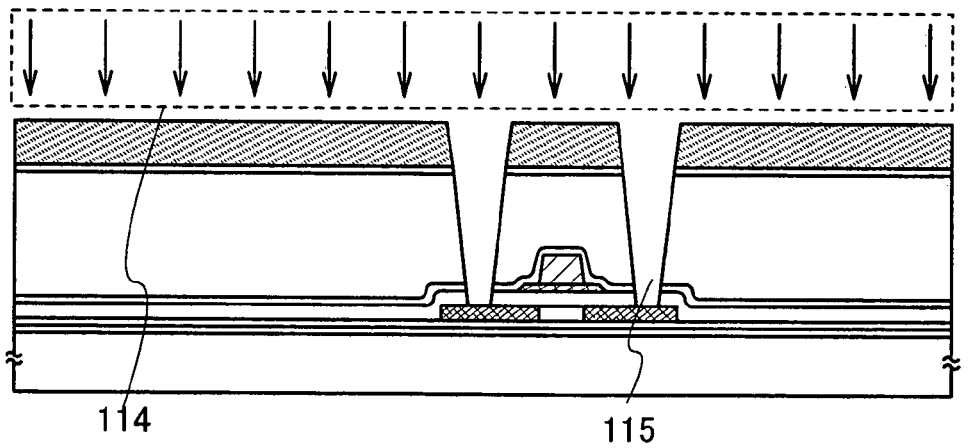

An opening which reaches the source region and the drain region is formed by etching the gate insulating film 105. A mask used for etching may be formed again, or a resist mask formed before may be used. The etched thermostability planarizing film 109 may be also used as the mask. The opening may be formed by etching the gate insulating film 105 after etching the thermostability planarizing film 109. In this embodiment mode, a contact hole (an opening) 115 which reaches an impurity region is formed by etching the gate insulating film 105, using the resist mask 110, the insulating film 111, the thermostability planarizing film 109 and the insulating film 108 as a mask (see FIG. 1C). $CHF_3$, Ar, He or the like is preferably used for an etching gas. In the invention, an inert gas is added to the etching gas to be used. As the inert element to be added, one kind or a plural kinds of He, Ne, Ar, Kr and Xe can be used. In the invention, one kind or plural kinds of Ar, Kr or Xe which have comparatively large atomic radius among inert elements may be added so as to be 60% or more and 85% or less, more preferably, with 65% or more and 85% or less of the total flow. Above all, it is preferable to use argon since it has the comparatively large atomic radius and is inexpensive. In this embodiment mode, etching treatment of the gate insulating film 105 may be performed with an etching gas 114 in which $CHF_3$ and Ar are used as etching gas. It is preferable to perform overetching by increasing the etching time at the rate of about from 10% to 20% in order to etch the gate insulating film 105 with leaving further less residue. According to the etching of the invention, a contact hole with a preferable shape can be formed without residue.

Figure 1D:
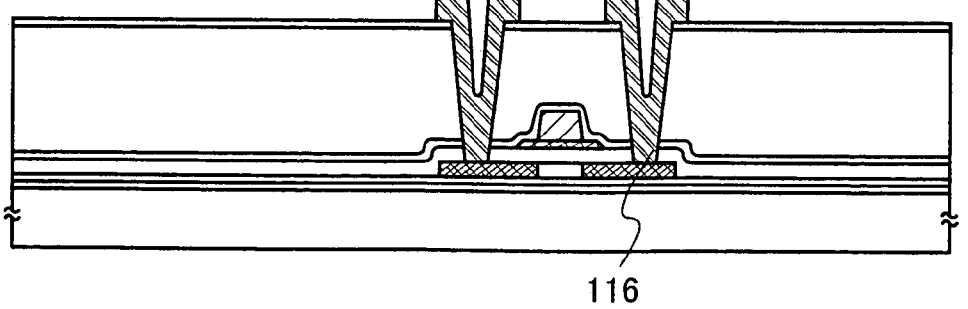

A metal film is formed and etched to form a wiring 116 being electrically connected to each impurity region. The wiring 116 functions as a source electrode or a drain electrode. As the metal film, a film containing an element of aluminum (Al), titanium (Ti), molybdenum (Mo), tungsten (W) or silicon (Si), or an alloy film using these elements may be used. In this embodiment mode, after TiN, Al, TiN are laminated in 100 nm, 350 nm, 100 nm thick respectively, patterned to have a desired shape to form a wiring (see FIG. 1D). TiN is one of materials which has a preferable adhesiveness with a thermostability planarizing film. When silicon oxide (SiOx) containing an alkyl group is used for the thermostability planarizing film and Ti is laminated as a wiring, a bond of Si—O—Ti is generated at the interface; therefore, a "bond a" of O—Ti is generated. On the other hand, when TiN is laminated as a wiring, a bond of Si—N—Ti is generated at the interface; therefore, a "bond b" of Si—N and a "bond c" of N—Ti are generated. Adhesiveness is poor since O—Ti binding power which is the "bond a" is weak. However, adhesiveness is favorable since the binding power of the "bond b" of Si—N and the "bond c" of N—Ti is strong; therefore, a peeling is unlikely to occur. Moreover, it is preferable that the N content of TiN is set less than 44 atomic % to have a contact with the source region or the drain region of the TFT. More preferably, the N content of TiN is set at more than 7 atomic % and less than 44 atomic %. The step may be simplified by making a conductive film two-layer structure of TiN and Al.

Etching is performed by ICP (Inductively Coupled Plasma) etching by using $BCl_3$ and $Cl_2$. Etching condition is that electric power applied to a coil-shaped electrode is set at 450 W; electric power applied to an electrode on a substrate side, 100 W; and pressure, 1.9 Pa. At this time, the insulating film 111 formed before serves as an etching stopper. The surface of the insulating film 111 has no residue with high planarity even after the wiring is etched by selecting materials having high selective ratio for the wiring 116 and the insulating film 111. If the insulating film 111 has high planarity, reliability of a semiconductor device is enhanced since disconnection, short circuit and the like of an electrode can be prevented even when a first electrode is formed as a pixel electrode over the insulating film 111.

An active matrix substrate equipped with a TFT is completed according to the above-mentioned steps. In this embodiment mode, only a p-channel TFT is shown in a pixel region, there may be n-channel TFT, and the n-channel TFT may be any one of a single gate structure where a channel forming region is formed, a double gate structure where two channel forming regions are formed, or a triple gate structure where three channel forming regions are formed. A TFT in a drive circuit portion may be also any one of a single gate structure, a double gate structure, or a triple gate structure.

The present invention is applicable to a top gate type (a planar type), a bottom gate type (an inversed stagger type), a dual gate type which has two gate electrodes disposed through a gate insulating film above and below a channel formation region, or other structure without being limited to a method for manufacturing the TFT shown in this embodiment mode.

Then, a first electrode (also referred to as a pixel electrode) 118 is formed to contact with the wiring 116. The first electrode functions as an anode or a cathode. As the first electrode, a film containing a substance of Ti, TiN, $TiSi_xN_y$, Ni, W, $WSi_x$, $WN_x$, $WSi_xN_y$, NbN, Cr, Pt, Zn, Sn, In or Mo, mainly containing an alloy material or a compound material mainly containing the substance, or a laminate of the films may be used within the range of a film thickness of from 100 nm to 800 nm in total.

In this embodiment mode, a light emitting element is used as a display element, and the first electrode has light-transmitting properties since this embodiment has a structure where light from the light emitting element is extracted from the first electrode side. The first electrode 118 is formed by establishing a transparent conductive film as the first electrode and etching the transparent conductive film to have a desired shape. As the first electrode 118, a transparent conductive film in which zinc oxide (ZnO) of from 2% to 20% is mixed to indium oxide in addition to ITO, IZO and ITSO may be used. As the first electrode 118, a titanium nitride film or a titanium film may be used in addition to the transparent conductive film. In this case, the titanium nitride film or the titanium film is formed in a film thickness which transmits light (preferably about from 5 nm to 30 nm) after forming the transparent conductive film. In this embodiment mode, ITSO is used as the first electrode 118. ITSO remains in an amorphous state since ITSO is not crystallized as ITO even when baking is performed. Accordingly, short circuit is unlikely to occur with the cathode even if a layer containing an organic compound is thin since ITSO has higher planarity than ITO. The first electrode 118 may be cleaned or polished with CMP and a polyvinyl alcohol porous body so that its surface be flatted. After polishing by CMP, UV ray irradiation, oxygen plasma treatment and the like may be performed on the surface of the first electrode 118.

Then, an insulator 119 (referred to as a bank, a partition, a mound, or the like) which covers an end portion of the first electrode 118 and the wiring 116 is formed. As the insulator 119, an SOG film obtained by application method (for example, an SiOx film containing an alkyl group) is used within the range of a film thickness of from 0.8 μm to 1 μm. Either dry etching or wet etching can be used for etching. Here, the insulator 119 is formed by dry etching with the use of a combination gas of $CF_4$, $O_2$ and He. The dry etching is performed by setting pressure at 5 Pa; power, 1500 W; flow of $CF_4$, 25 sccm; $O_2$, 25 sccm; and He, 50 sccm. In the dry etching, the etching rate of the SiOx film containing an alkyl group is from 500 nm/min to 600 nm/min. On the other hand, the etching rate of the ITSO film is less than 10 nm/min; therefore, sufficient selective ratio can be obtained. The TiN film which has preferable adhesiveness is the outermost surface since the wiring 116 is covered by the insulator 119 including the SiOx film containing an alkyl group. As the insulator 119, in addition to an insulating film in which a skeletal structure is configured by the bond of silicon (Si) and oxygen (O), a film including one kind or plural kinds of an inorganic material (silicon oxide, silicon nitride, silicon oxynitride, silicon nitride oxide and the like), an organic material (an organic resin material) of photosensitive or non-photosensitive (polyimide, acrylic, polyamide, polyimidamide, resist, benzocyclobutene, and the like), or a lamination layer of these films can be used as long as the materials have high heat resistance and preferable planarity.

It is preferable to degas in order to enhance reliability by performing vacuum heating before forming a light emitting layer 117 containing an organic compound. For example, it is preferable to perform heat treatment of temperatures from 200° C. to 300° C. under the reduced atmosphere or the inert atmosphere to remove a gas contained in a substrate before evaporating an organic compound material. Here, it does not cause any problem even if high heating treatment is added since the interlayer insulating film and the partition are formed of a silicon oxide (SiOx) film having high thermostability. Therefore, a step for enhancing reliability by heating treatment can be performed sufficiently.

Figure 2:
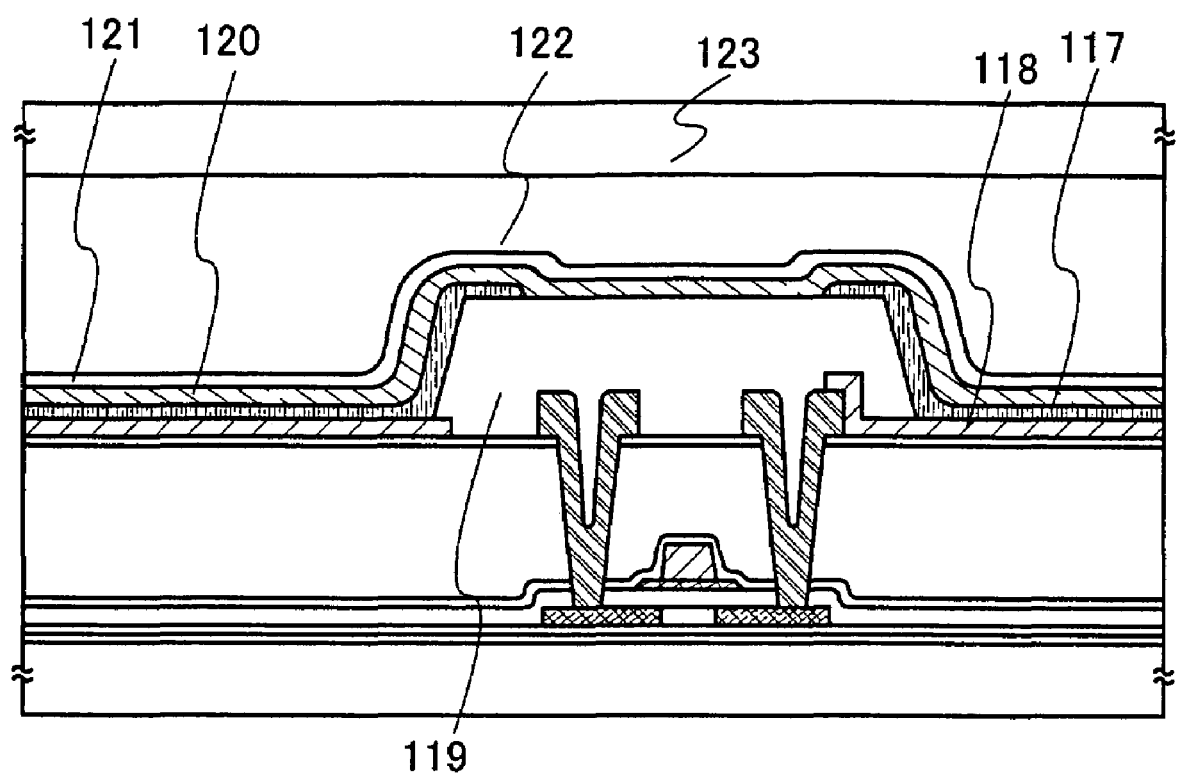
FIG. 2 shows a structure of the invention.

The light emitting layer 117 is formed over the first electrode 118. Incidentally, although FIG. 2 shows only one pixel, this embodiment separately forms the light emitting layer correspondingly to the respective colors of R (red), G (green) and B (blue). Each luminescence may be luminescence (fluorescence) in returning from a singlet excited state to the ground state, or luminescence (phosphorescence) in returning from a triplet excited state to the ground state. Alternatively, luminescence may be combined so that one color is fluorescence (or phosphorescence) and the other two colors are phosphorescence (or fluorescence). Phosphorescence may be used for only R and fluorescence may be used for G and B. Specifically, a laminated structure where a copper phthalocyanine (CuPc) film with a thickness of 20 nm is formed as a hole injection layer, and tris-8-quinolinolate aluminum complex ($Alq_3$) film with a thickness of 70 nm is formed thereupon as a light emitting layer may be used. The color of emission light can be controlled by adding a fluorescent dye such as quinacridon, perylene or DCM1 to $Alq_3$.

However, the foregoing example is an example of an organic light emitting material capable of being used for a light emitting layer and not necessarily limited thereto. It is satisfactory to form a light emitting layer (layer for light emission and carrier movement therefore) by freely combining a light emitting layer, a charge transporting layer and a charge injecting layer. For example, although in this embodiment mode, the example in which a low molecular weight organic light emitting material is used for a light emitting layer is shown, it is possible to use an intermediate molecular weight organic light emitting material and a high molecular weight organic light emitting material. Furthermore, an organic light emitting material, having no sublimation property but having molecules in the number of 20 or less or chained molecules having a length of 10 µm or less, is provided as a intermediate molecular weight organic light emitting material. For an example of using the high molecular weight organic light emitting material, a laminated structure where a polythiophene (PEDOT) film with a thickness of 20 nm is formed by the spin coating as a hole injecting layer and a paraphenylenvinylene (PPV) film of about 100 nm is provided thereon as a light emitting layer may be employed. The luminescence wave length from red to blue can be selected by using the π-conjugated type high molecular weight of PPV. Meanwhile, it is possible to use an inorganic material such as silicon carbide for a charge transporting layer or a charge injecting layer. These organic light emitting materials or inorganic materials can be a known material.

Then, a second electrode 120 formed of a conductive film is provided on the light emitting layer 117. In this embodiment mode, as the electrode 120, a material having small work function (Al, Ag, Li, Ca, an alloy of these: MgAg, MgIn, AlLi, or a compound of these: $CaF_2$ or CaN) may be used since the first electrode functions as an anode and the second electrode functions as a cathode. As the second electrode 120, a metal film formed from Al, Ag, Li, Ca or an alloy of these: MgAg, MgIn, AlLi (a film thickness of from 50 nm to 200 nm) is preferably used since this embodiment mode has a structure where the second electrode 120 functions as a cathode and light is extracted from the side of the first electrode 118 which functions as an anode. However, the invention is not limited thereto and a TFT in a pixel portion can also serves as an n-channel TFT; the first electrode 118, a cathode; and the second electrode 120, an anode.

It is effective to provide a passivation film 121 so as to cover the second electrode 120. The passivation film may be formed of an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) containing more nitrogen than oxygen, aluminum oxide, diamond like carbon (DLC) or a nitrogen-containing carbon (CN), and the insulating film may be used in a monolayer or a lamination. A material in which a skeletal structure is configured by the bond of silicon (Si) and oxygen (O) and at least hydrogen is contained in a substituent, or a material having at least one kind of fluorine, an alkyl group or aromatic hydrocarbon as a substituent may be also used.

At this time, it is preferable to use a film having preferable coverage as a passivation film, and it is effective to use a carbon film, in particular, a DLC film. The DLC film can be easily formed over the light emitting layer 117 having low heat resistance since the DLC film can be formed within the temperature range of from room temperature to 100° C. or less. The DLC film can be formed by plasma CVD (typically, RF plasma CVD, microwave CVD, electron cyclotron resonance (ECR) CVD, hot-filament CVD and the like), combustion-flame method, sputtering, ion beam vapor deposition, and laser vapor deposition. A hydrogen gas and a hydro carbon-based gas (for example, $CH_4$, $C_2H_2$, $C_6H_6$, and the like) are used as a reaction gas used to form the film and are ionized by glow discharge. The ions are accelerated to collide against the cathode to which negative self-bias is applied. The CN film may be formed by using $C_2H_4$ gas and $N_2$ gas as reaction gas. The DLC film has high blocking effect on oxygen and can prevent oxidation of the light emitting layer 117. Therefore, a problem that the light emitting layer 117 is oxidized during a following sealing step can be prevented.

The light emitting element is sealed by attaching a sealing substrate 123 with a sealing material. The sealing substrate 123 is attached so that the sealing material covers an end portion of the thermostability planarizing film 109. The reliability of a semiconductor device improves because intrusion of moisture from a cross-section surface is prevented by the sealing material contributing to prevention of deterioration of the light emitting element. A region surrounded by the sealing material is filled with a filler 122. The filler 122 need not have light-transmitting properties since this embodiment mode has a structure in which light is extracted from the side of the first electrode 118. However, when a structure in which light is extracted by transmitting through the filler 122 is employed, the filler 122 needs to have light-transmitting properties. Typically, an epoxy resin of visible light curing, ultraviolet ray curing or thermosetting may be used. Here, a UV epoxy resin (product name: 2500 Clear, manufactured by Electrolite Corporation), which has an refractive index equal to 1.50; viscosity, 500 cps; shore D hardness, 90; a tensile strength, 3,000 psi; a Tg point, 150° C.; a volumetric resistivity, $1 \times 10_{15}$ Ω·cm; and a withstand voltage, 450 V/mil may be used. Incidentally, the whole transmittance can be improved by filling the filler 122 between a pair of substrates.

The thermostability planarizing film 109, typically, a material in which a skeletal structure is configured by the bond of silicon (Si) and oxygen (O) is used for an interlayer insulating film of a TFT, and the same material is used also for the insulator 119 in a semiconductor device (an active matrix light emitting display device) manufactured in this way. A material containing silicon oxide which is relatively stable is used for a configuration material of a semiconductor device (an active matrix light emitting display device).

Further, an etching residue is reduced to form an opening by etching with preferable planarity at the time of forming the opening such as a contact hole in a laminated structure constituting a semiconductor device. Hence, a highly reliable semiconductor device can be manufactured by preventing defectiveness such as short circuit or disconnection of wiring and the like.

Embodiment 1

In this embodiment, manufacturing steps of a semiconductor device described in the embodiment mode are explained with reference to FIGS. 1A to 1D and FIG. 2.

A silicon nitride oxide film 101b having a thickness of 50 nm and a silicon oxynitride film 101a having a thickness of 100 nm are formed over a glass substrate 100 as a base film 101 by plasma CVD.

A semiconductor film is then formed over the insulating film. An amorphous silicon film with 54 nm thick is formed by plasma CVD as the semiconductor film in this embodiment. In this embodiment, laser crystallization is performed on the amorphous silicon film to form a crystallized semiconductor film. The hydrogen concentration content in the amorphous silicon film is emitted to be $1 \times 10^{20}$ atoms/cm$^3$ or less by heating for one hour at 500° C. under the nitrogen atmosphere before irradiating the amorphous silicon film with laser light.

Laser crystallization is a method for irradiating a semiconductor film with laser light. The laser to be used is preferably a solid laser, a gas laser, or a metal laser with pulsed or continuous oscillation. Examples of a solid laser include, a YAG laser, a $YVO_4$ laser, a YLF laser, a $YAlO_3$ laser, a glass laser, a ruby laser, an alexandrite laser, and a Ti: sapphire laser and the like. Examples of a gas laser include an excimer laser, an Ar laser, a Kr laser, and a $CO_2$ laser and the like, and examples of a metal laser include a helium-cadmium laser.

A minute amount of impurity element (boron or phosphorus) is doped to the crystalline semiconductor film thus obtained to control a threshold voltage of the TFT.

A semiconductor layer 102 is formed by manufacturing a first photomask to perform patterning treatment using photolithography.

A gate insulating film 105 covering the semiconductor layer 102 is formed. In this embodiment, a silicon oxynitride film is formed to have a thickness of 115 nm by plasma CVD.

Subsequently, a first conductive film with a film thickness of from 20 nm to 100 nm and a second conductive film with a film thickness of from 100 nm to 400 nm which is used as a gate electrode are laminated on the gate insulating film 105. In this embodiment, a tantalum nitride film with a film thickness of 30 nm as the first conductive film, and a tungsten film with a film thickness of 370 nm as the second conductive film are sequentially laminated on the gate insulating film 105.

Then, a second photomask formed from a resist is manufactured by using photolithography to perform first etching treatment for forming an electrode and a wiring. The first conductive film and the second conductive film can be etched to have a desired tapered shape by appropriately adjusting an etching condition (electric power applied to a coil-shaped electrode, electric power applied to an electrode on a substrate side, electrode temperature on a substrate side and the like) by using an ICP (Inductively Coupled Plasma) etching. As an etching gas, a chlorine-based gas typified by $Cl_2$, $BCl_3$, $SiCl_4$, $CCl_4$ or the like, a fluorine-based gas typified by $CF_4$, $SF_6$, $NF_3$ or the like, and $O_2$ can be appropriately used.

A conductive layer with a first shape including the first conductive layer and the second conductive layer is formed by the first etching treatment.

Then, second etching treatment is performed without removing a mask formed from a resist. Here, a W film is selectively etched. At this time, the second conductive layer is formed by the second etching treatment. On the other hand, most of the first conductive layer is not etched and forms a second shape conductive layer. Hence, a conductive layer 106 and a conductive layer 107 are formed. In this embodiment mode, the conductive layer is formed by dry etching.

Next, a resist mask is newly formed by using a third photomask after removing the resist mask. A first doping step is performed to dope an impurity element which imparts n-type conductivity (typically phosphorus (P) or arsenic (As)) to a semiconductor at the low concentration to form an n-channel TFT not shown here. The resist mask covers a region to be a p-channel TFT and a region adjacent to the conductive layer. A low concentration impurity region is formed by performing through doping via the insulating film by the first doping step. Plural TFTs are used to drive one light emitting element. However, the above-mentioned doping step is not necessary when the light emitting element is driven only by p-channel TFT.

Then, a resist mask is newly formed by using a fourth photomask after removing the resist mask. A second doping step is performed to dope an impurity element which imparts p-type conductivity (typically, boron (B)) at the high concentration. P-type high concentration impurity regions 103 and 104 are formed by performing through doping via the gate insulating film 105 by the second doping step.

Then, a resist mask is newly formed by using a fifth photomask. A third doping step is performed to dope an impurity element which imparts n-type conductivity (typically, phosphorus or As) to a semiconductor at the high concentration to form an n-channel TFT not shown here. The third doping step is performed under the condition that the amount of doze is set at from $1 \times 10^{13}$ atoms/cm$^2$ to $5 \times 10^{15}$ atoms/cm$^2$; and the acceleration voltage, from 60 kV to 100 kV. The resist mask covers a region to be a p-channel TFT and a region adjacent to the conductive layer. An n-type high concentration impurity region is formed by performing through doping via the gate insulating film 105 by the third doping step.

To the above-mentioned steps, the impurity region is formed in each semiconductor layer.

Subsequently, an insulating film 108 containing hydrogen is formed as a passivation film after removing the mask formed from a resist. In this embodiment, a silicon nitride oxide (SiNO) film is formed to have a film thickness of 50 nm by plasma CVD.

Furthermore, a step of hydrogenating the semiconductor layer is performed. In this embodiment, the semiconductor layer is hydrogenated by performing heat treatment for one hour at 410° C. under the nitrogen atmosphere.

A thermostability planarizing film 109 to be an interlayer insulating film is then formed. As the thermostability planarizing film 109, an insulating film in which a skeletal structure is configured by the bond of silicon (Si) and oxygen (O) obtained by application is used.

The formation procedure of the thermostability planarizing film 109 is omitted here since it has been already described in the embodiment mode.

In this way, the thermostability planarizing film 109 is formed.

An insulating film 111 is formed as a passivation film (see FIG. 1A). In this embodiment, a silicon nitride film is formed by sputtering to have a film thickness of 100 nm. Ar may be contained in the film, and in this embodiment, Ar is contained in the film at the concentration of from $5 \times 10^{18}$ atoms/cm$^3$ to $5 \times 10^{20}$ atoms/cm$^3$. The insulating film 111 is provided as an etching stopper film to protect the thermostability planarizing film 109 which is an interlayer insulating film when patterning a wiring 116 (also used as a drain electrode or a source electrode) in a later step.

Then, a contact hole (an opening) is formed in the thermostability planarizing film 109 with the use of a mask 110 formed from a resist. At the same time of the removing step, the thermostability planarizing film at a periphery region is also removed. In this embodiment, the insulating film 111 which is a passivation film and the insulating film 108 are formed above and below the thermostability planarizing film 109 so as to sandwich the thermostability planarizing film, and the gate insulating film 105 is formed thereunder. This embodiment shows two-step etching of a nitrogen film mainly containing nitrogen and an oxide film mainly containing oxygen is performed. However, the invention is not limited thereto. In this embodiment, the nitrogen film mainly containing nitrogen is used for the insulating film 111 and the insulating film 108, and the film mainly containing oxygen is used for a gate insulating film 105. Therefore, the insulating film 111, the thermostability planarizing film 109 and the insulating film 108 are simultaneously etched by an etching gas 112 to form an opening 113 (see FIG. 1B).

In this embodiment, etching (wet etching or dry etching) is performed under the condition where selective ratio can be obtained with respect to the gate insulating film 105. An inert gas is added to an etching gas to be used. As an inert element to be added, one kind or plural kinds of He, Ne, Ar, Kr and Xe can be used. In the invention, one kind or plural kinds of Ar, Kr and Xe is added from 26% to 50% of the total flow. In this embodiment, $CF_4$, $O_2$, He and Ar are used as the etching gas 112. $CHF_3$ or $C_4F_8$ may be added to the etching gas 112.

Figure 17:
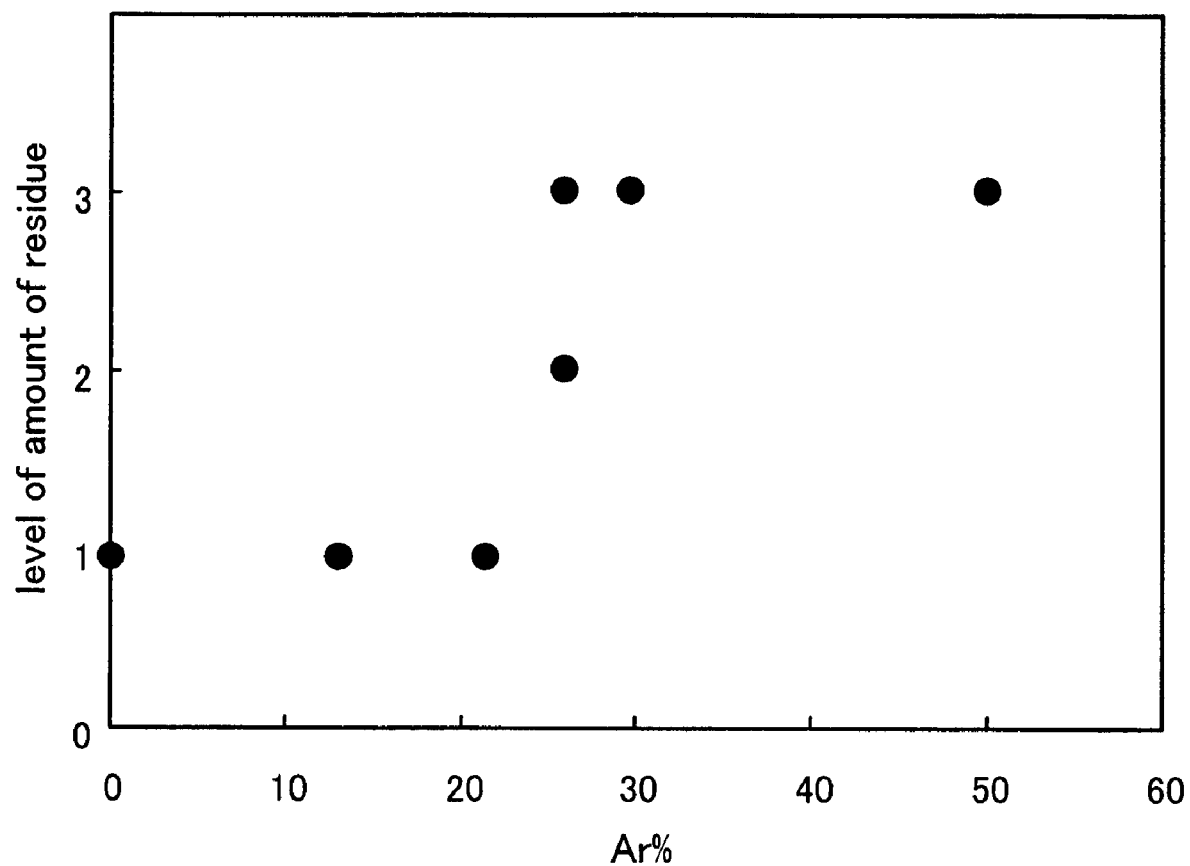
FIG. 17 is a graph showing a relation between the ratio of added inert gas and a residue according to the invention.

Ar is used as an inert gas. Then, an amount of a residue in an opening is measured when the flow of Ar of the total flow of the etching gas is changed at the time of etching. FIG. 17 is a graph showing the relationship between the amount of a residue and the flow ratio that Ar makes up of. The pressure is set at from 25 Pa to 40 Pa, and as a gas, $CF_4$, $O_2$, He and Ar are combined to use.

The degree of an amount of a residue is shown in three levels, and the less the residue is, the more a numerical number is. Hence, as the level of the residue becomes larger: 1, 2 and 3, etching is performed with preferable planarity since a residue in the opening portion reduces. As is understood with reference to FIG. 17, a residue decreases when the flow ratio of Ar becomes 26% or more, and it is confirmed that etching with preferable planarity can be performed with the flow rates of 30% and 50%. Therefore, in the invention, one kind or plural kinds of Ar, Kr and Xe is added by 26% to 50% of the total flow.

Figure 3:
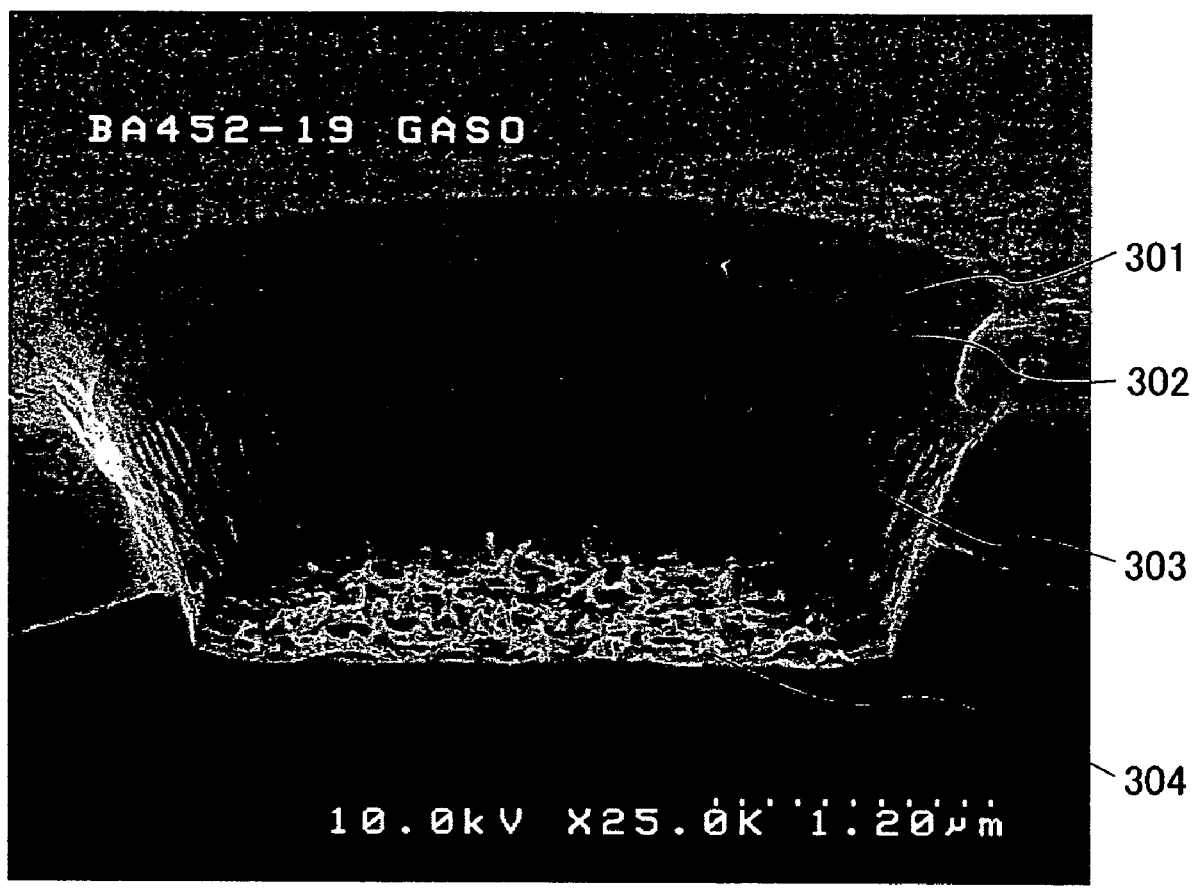
FIG. 3 shows an opening according to the invention.

In this embodiment, the insulating film 111, the thermostability planarizing film 109 and the insulating film 108 are etched up to the top of a silicon oxide ($SiO_2$) film which is the gate insulating film 105 by setting flow of $CF_4$ at 50 sccm; $O_2$, 25 sccm; He, 35 sccm; Ar, 25 sccm; RF power, 500 W; and pressure, 300 mTorr (about 40 Pa). The shape of the opening (contact hole) formed in this embodiment is shown in FIG. 3. In FIG. 3, reference numeral 301 denotes the mask 110 formed from a resist; 302, the insulating film 111; 303, the thermostability planarizing film 109; and 304, the gate insulating film 105. The formed contact hole has a tapered shape, and the diameter of the opening becomes smaller toward a bottom portion.

Figure 4:
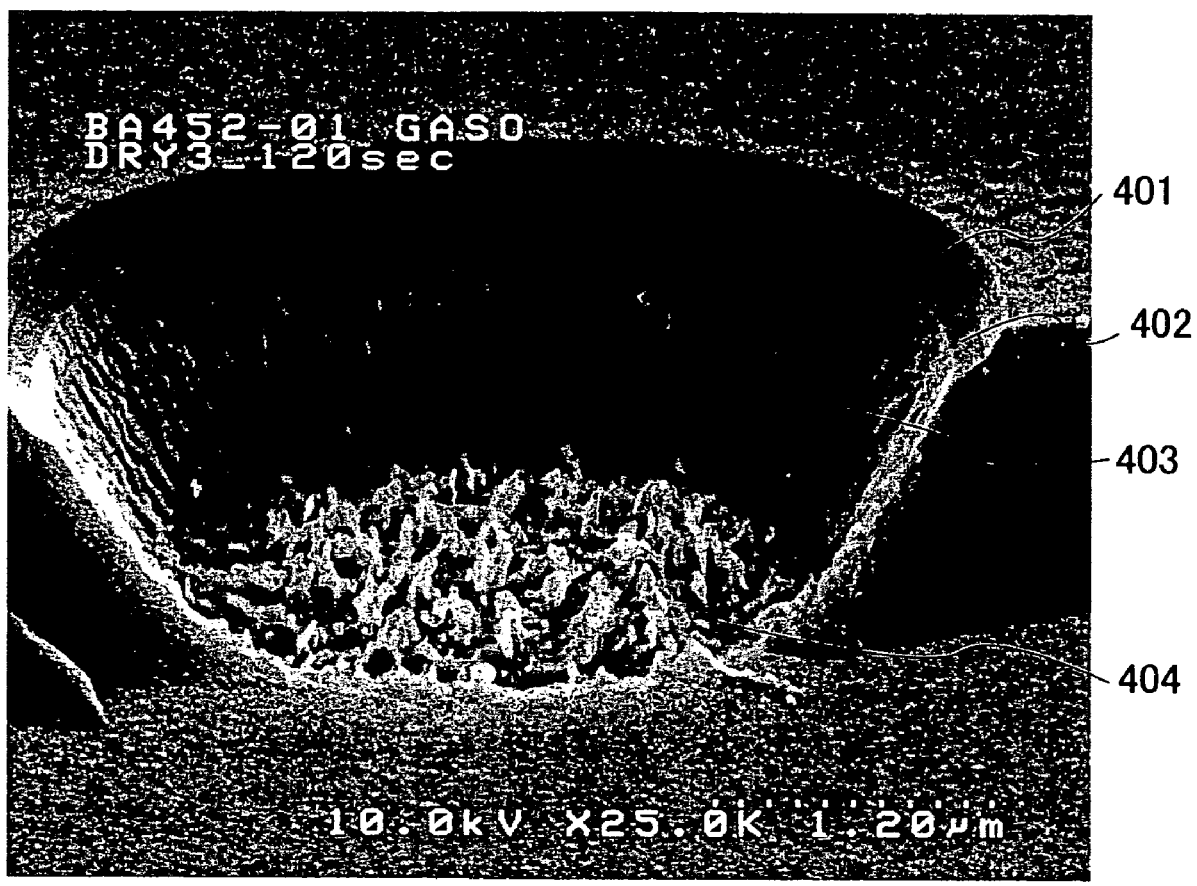
FIG. 4 shows an opening according to a comparative example.

As a comparative example, without adopting the invention, the insulating film 111, the thermostability planarizing film 109 and the insulating film 108 are etched up to the top of a silicon oxide ($SiO_2$) film which is a gate insulating film by setting flow of $CF_4$ at 50 sccm, $O_2$, 50 sccm; He, 35 sccm; RF power, 500 W; and pressure, 300 mTorr (about 40 Pa). The shape of a contact hole formed in the comparative example is shown in FIG. 4. In FIG. 4, reference numeral 401 denotes the mask 110 formed from a resist; 402, the insulating film 111; 403, the thermostability planarizing film 109; and 404, the gate insulating film 105. The formed contact hole is formed to have a tapered shape, and the diameter of the opening becomes smaller toward a bottom portion.

As shown in FIG. 4, the contact hole in which etching is performed under the conventional condition has a large amount of residue remaining at the bottom portion and too much unevenness. On the other hand, the contact hole formed by an etching under an etching condition added with Ar has less residue. As a cause of the effect, a sputtering effect due to Ar having comparatively a large atomic radius is conceivable.

When there is an etching residue due to insufficient etching, there is a possibility that a wiring resistance is changed, or a defective coverage is caused, thereby resulting in poor quality or characteristics when a wiring is formed. In the invention, an etching residue is reduced to etch the opening with preferable planarity when an opening such as a contact hole is formed in a laminated structure constituting a semiconductor device. Hence, a high reliable semiconductor device, and a method for manufacturing the semiconductor device with preferable yield can be provided.

Incidentally, to perform etching without leaving a residue on the gate insulating film 105, it is preferable to increase the etching time at the rate of about from 10% to 20%. The opening may be formed to have a tapered shape, and the tapered shape may be formed by performing etching once or plural times.

An opening which reaches a source region or a drain region is formed by etching the gate insulating film 105. In this embodiment, a contact hole (an opening) 115 which reaches an impurity region is formed by etching the gate insulating film 105 using the mask 110 formed from a resist, the insulating film 111, the thermostability planarizing film 109 and the insulating film 108 as a mask (see FIG. 1C). An inert gas is also added to an etching gas in the second step etching. As an inert element to be added, one kind or plural kinds of He, Ne, Ar, Kr and Xe can be used. In the invention, one kind or plural kinds of Ar, Kr and Xe having comparatively large atomic radius is added to the etching gas at a concentration from 60% to 85%, more preferably, from 65% to 85% of the total flow. Above all, it is preferable to use argon since it has the comparatively large atomic radius and is inexpensive. In this embodiment, etching treatment of the gate insulating film 105 is performed by an etching gas 114 in which $CHF_3$ and Ar are used.

As a comparative example, an example in which the insulating film 111, the thermostability planarizing film 109 and the insulating film 108 are etched up to the top of a silicon oxide ($SiO_2$) film which is the gate insulating film 105 by setting the flow of $CF_4$ at 50 sccm; $O_2$, 50 sccm; He, 35 sccm; RF power, 500 W; and pressure, 300 mTorr (about 40 Pa) has been previously shown. Examples in which the second step etching is performed on the gate insulating film 105 under different conditions in the situation of the comparative example are described respectively as follows.

Figure 12:
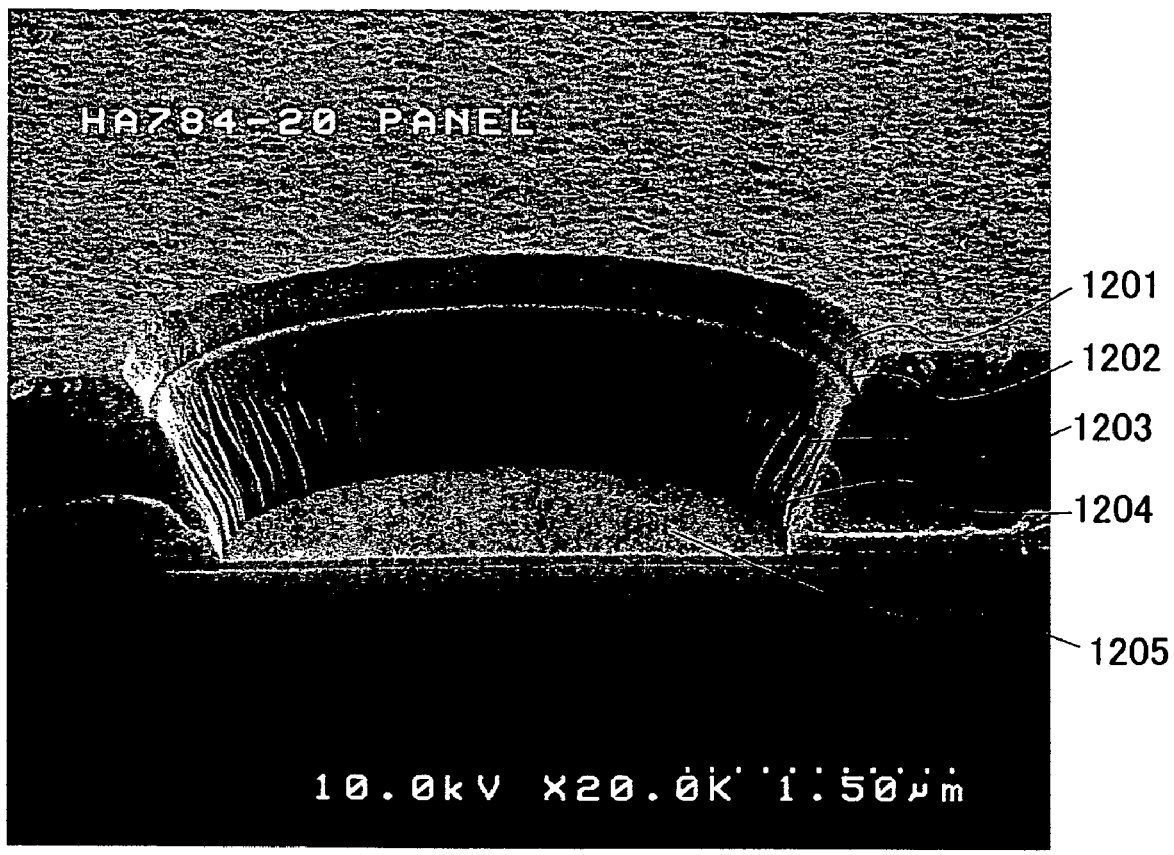
FIG. 12 shows an opening according to the invention.

In one of the examples, Ar is used as an inert gas added to an etching gas at the second step etching. Etching is performed by ICP etching by using 48 sccm of $CHF_3$, and 152 sccm of Ar and setting electric power applied to a coil-shaped electrode at 50 W; electric power applied to an electrode on a substrate side, 450 W; and pressure, 5.5 Pa. A shape of the formed contact hole by using Ar is shown in FIG. 12. In FIG. 12, reference numeral 1201 denotes the mask 110 formed from a resist; 1202, the insulating film 111; 1203, the thermostability planarizing film 109; 1204, the gate insulating film 105; and 1205, the impurity region of the semiconductor layer.

Figure 14:
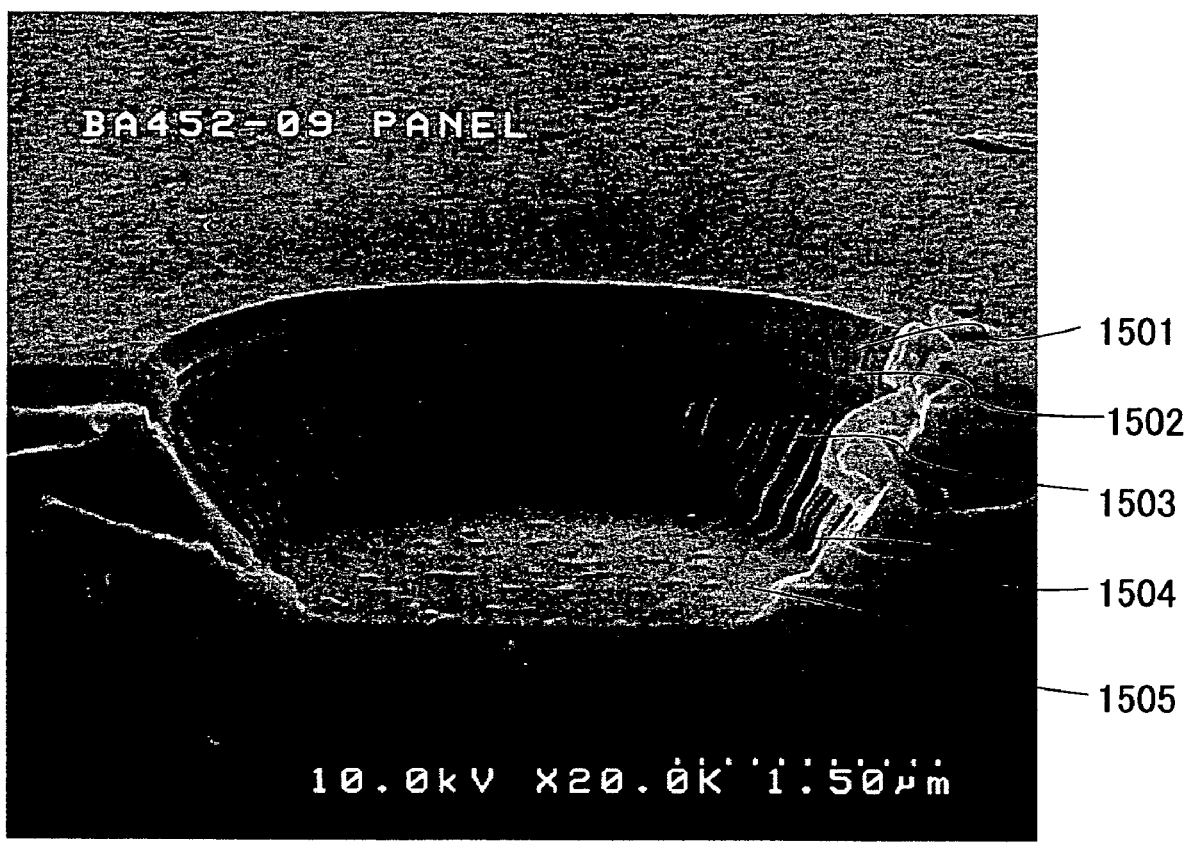
FIG. 14 shows an opening according to a comparative example.

In the other of the examples, He is used as an inert gas added to an etching gas at the second step etching. Etching is performed by ICP (Inductively Coupled Plasma) etching by using 48 sccm of $CHF_3$, and 152 sccm of He and setting electric power applied to a coil-shaped electrode at 50 W; electric power applied to an electrode on a substrate side, 450 W; and 5.5 Pa. A shape of the formed contact hole by using He is shown in FIG. 14. In FIG. 14, reference numeral 1501 denotes the mask 110 formed from a resist; 1502, the insulating film 111; 1503, the thermostability planarizing film 109; 1504, the gate insulating film 105; and 1505, the impurity region of the semiconductor layer.

As shown in FIG. 14, a shape of the contact hole in which etching is performed under the etching condition where He is used instead of Ar has unevenness as a trace of transcription of the residue. However, a shape of the contact hole formed by the etching under the condition where Ar is added has no unevenness; therefore a contact hole is formed with preferable planarity. As a cause of the effect, a sputtering effect due to Ar having a comparatively large atomic radius is conceivable.

In the invention, when an inert gas such as Ar is not added at the first step etching, Ar is added to an etching gas at the second step etching. A preferable contact hole having no residue as shown in FIG. 12 can be formed according to the invention. When etching residue remains in the contact hole due to insufficient etching, there is a possibility that a wiring resistance is changed, or a defective coverage is caused thereby, resulting in poor quality or characteristics when a wiring is formed. According to the invention, an opening is etched with preferable planarity by reducing an etching residue when an opening such as a contact hole is formed in a laminated structure constituting a semiconductor device. Hence, a high reliable semiconductor device, and a method for manufacturing the semiconductor device with preferable yield can be provided. Incidentally, over etching may be performed about from 100% to 300% at the second step etching in order to perform etching with further less residue on a semiconductor layer.

A metal film is formed and etched to form a wiring 116 being electrically connected to each impurity region. The wiring 116 functions as a source electrode or a drain electrode. As the metal film, a film formed from an element of aluminum (Al), titanium (Ti), molybdenum (Mo), or tungsten (W) or an alloy film using these elements may be used. In this embodiment, after TiN, Al and TiN are laminated in 100 nm, 350 nm, 100 nm thick respectively, they are patterned to have a desired shape to form a wiring (see FIG. 1D). TiN is one of materials which has a preferable adhesiveness with the thermostability planarizing film. When silicon oxide (SiOx) containing an alkyl group is used for the thermostability planarizing film and Ti is laminated as a wiring, a bond of Si—O—Ti is generated at the interface therebetween; therefore, a "bond a" of O—Ti is generated. On the other hand, when TiN is laminated as a wiring, a bond of Si—N—Ti is generated at the interface therebetween; therefore, a "bond b" of Si—N and a "bond c" of N—Ti are generated. In case of using Ti as the wiring, adhesiveness between the thermostability planarizing film and the wiring is poor since O—Ti binding power which is the "bond a" is weak. However, in case of using TiN as the wiring, adhesiveness between the thermostability planarizing film and the wiring is favorable since the binding power of the "bond b" of Si—N and the "bond c" of N—Ti is strong; therefore, peeling is unlikely to cause. Moreover, it is preferable that the N content of TiN is set less than 44 atomic % to have a contact with the source region or the drain region of the TFT. More preferably, the N content of TiN may be set at more than 7 atomic % and less than 44 atomic %. The step may be simplified by making a conductive film a two-layer structure of TiN and Al.

Etching may be performed by ICP etching by using $BCl_3$ and $Cl_2$. Etching condition is that electric power applied to a coil-shaped electrode is set at 450 W; electric power applied to an electrode on a substrate side, 100 W; and pressure, 1.9 Pa. At this time, the insulating film 111 formed before serves as an etching stopper. The surface of the insulating film 111 has no residue having high planarity even after etching of the wiring by selecting materials with high selective ratio for the wiring 116 and the insulating film 111. If the insulating film 111 has high planarity, reliability of a semiconductor device is enhanced since disconnection, short circuit and the like of an electrode can be prevented even when a first electrode is formed as a pixel electrode over the insulating film 111.

An active matrix substrate equipped with a TFT is completed through the above-mentioned steps.

A first electrode (also referred to as a pixel electrode) 118 is formed to contact with the wiring 116.

In this embodiment, the first electrode has light-transmitting properties since this embodiment has a structure in which a light emitting element is used as a display element, and light from the light emitting element is extracted from the first electrode side. In this embodiment, ITSO is used as the first electrode 118. ITSO is formed by sputtering using a target in which silicon oxide is contained in ITO at a concentration from 2% to 10% by weight. The first electrode 118 may be cleaned or polished with CMP and a polyvinyl alcohol porous body so that its surface to be flattened.

Then, an insulator 119 (referred to as a bank, a partition, a mound, or the like) which covers an end portion of the first electrode 118 and the wiring 116 is formed. As the insulator 119, an SOG film obtained by application method (for example, an SiOx film containing an alkyl group) is used within the range of a film thickness of from 0.8 μm to 1 μm. The insulator 119 is formed by dry etching using a mixed gas of $CF_4$, $O_2$ and He. The dry etching is performed by setting pressure at 5 Pa; electric power, 1500 W; flow of $CF_4$, 25 sccm; $O_2$, 25 sccm; and He, 50 sccm. The TiN film which has preferable adhesiveness is the outermost surface since the wiring 116 is covered by the insulator 119 including the SiOx film containing an alkyl group.

A degasification is performed by vacuum heating before forming the light emitting layer 117 containing an organic compound to enhance reliability. Heat treatment of temperatures from 200° C. to 300° C. is performed under the reduced atmosphere or the inert atmosphere to remove a gas contained in a substrate before evaporating an organic compound material. In this embodiment, it does not cause any problem even if high heating treatment is added since the interlayer insulating film and the partition are formed from a silicon oxide (SiOx) film having high thermostability. Therefore, a step for enhancing reliability by heating treatment can be performed sufficiently.

The light emitting layer 117 is formed on the first electrode 118. In this embodiment, since the first electrode 118 functions as an anode, a laminated structure where a copper phthalocyanine (CuPc) film with a thickness of 20 nm may be formed thereupon as a hole injection layer, and tris-8-quinolinolate aluminum complex ($Alq_3$) film with a thickness of 70 nm is formed thereupon as a light emitting layer is formed. The color of emission light can be controlled by adding a fluorescent dye such as quinacridon, perylene or DCM1 to $Alq_3$.

Then, a second electrode 120 formed from a conductive film is provided on the light emitting layer 117. In this embodiment, as the electrode 120, a material having small work function (Al, Ag, Li, Ca, an alloy of these: MgAg, MgIn, AlLi, or a compound of these: $CaF_2$ or CaN) may be used since the first electrode functions as an anode and the second electrode functions as a cathode. In this embodiment, as the second electrode 120, a metal film (a film thickness of from 50 nm to 200 nm) formed from Al, Ag, Li, Ca or an alloy of these: MgAg, MgIn, AlLi is preferably used since the second electrode 120 functions as a cathode and light is extracted from the side of the first electrode 118 which functions as an anode.

A passivation film 121 is provided so as to cover the second electrode 120. In this embodiment, a silicon nitride film is formed by making the atmosphere inside the film formation chamber a nitride atmosphere or an atmosphere including nitrogen and argon by using a diskform target formed form silicon.

Next, the light emitting element is sealed by attaching a sealing substrate 123 with a sealing material. The sealing substrate 123 is attached so that the sealing material covers an end portion of the thermostability planarizing film 109. The reliability of a semiconductor device (a light emitting display device) improves because intrusion of moisture from a cross-section surface is prevented by the sealing material contributing toprevention of deterioration of the light emitting element. A region surrounded by the sealing material is filled with a filler 122. The filler 122 need not have light-transmitting properties since this embodiment has a structure in which light is extracted from the side of the first electrode 118. However, when a structure in which light is extracted by transmitting through the filler 122 is employed, the filler 122 needs to havelight-transmitting properties. Typically, an epoxy resin of visible light curing, ultraviolet ray curing or thermosetting may be used. Here, a UV epoxy resin (product name: 2500 Clear, manufactured by Electrolite Corperation) which has a refractive index equal to 1.50; viscosity, 500 cps; shore D hardness, 90; a tensile strength, 3,000 psi; a Tg point, 150° C. volumetric resistivity, $1\times10^{15}$ Ω·cm; and a withstand voltage, 450 V/mil is used. Incidentally, the whole transmittance can be improved by filling the filler 122 between a pair of substrates.

Figure 8:
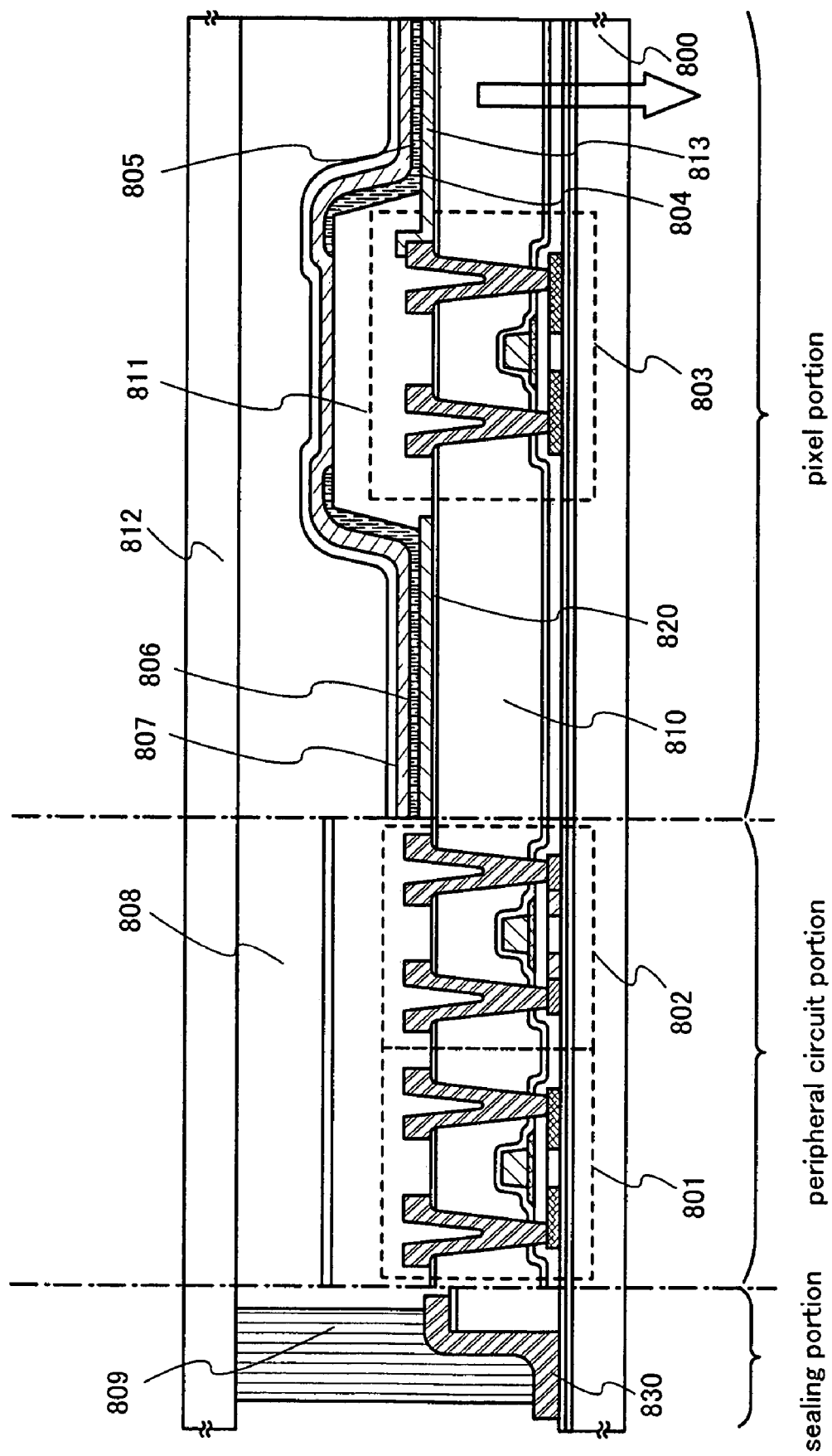
FIG. 8 is a cross-sectional view of a semiconductor device according to the invention.

A semiconductor device manufactured in this embodiment is described in more detail with reference to FIG. 8 and FIG. 15.

Figure 15:
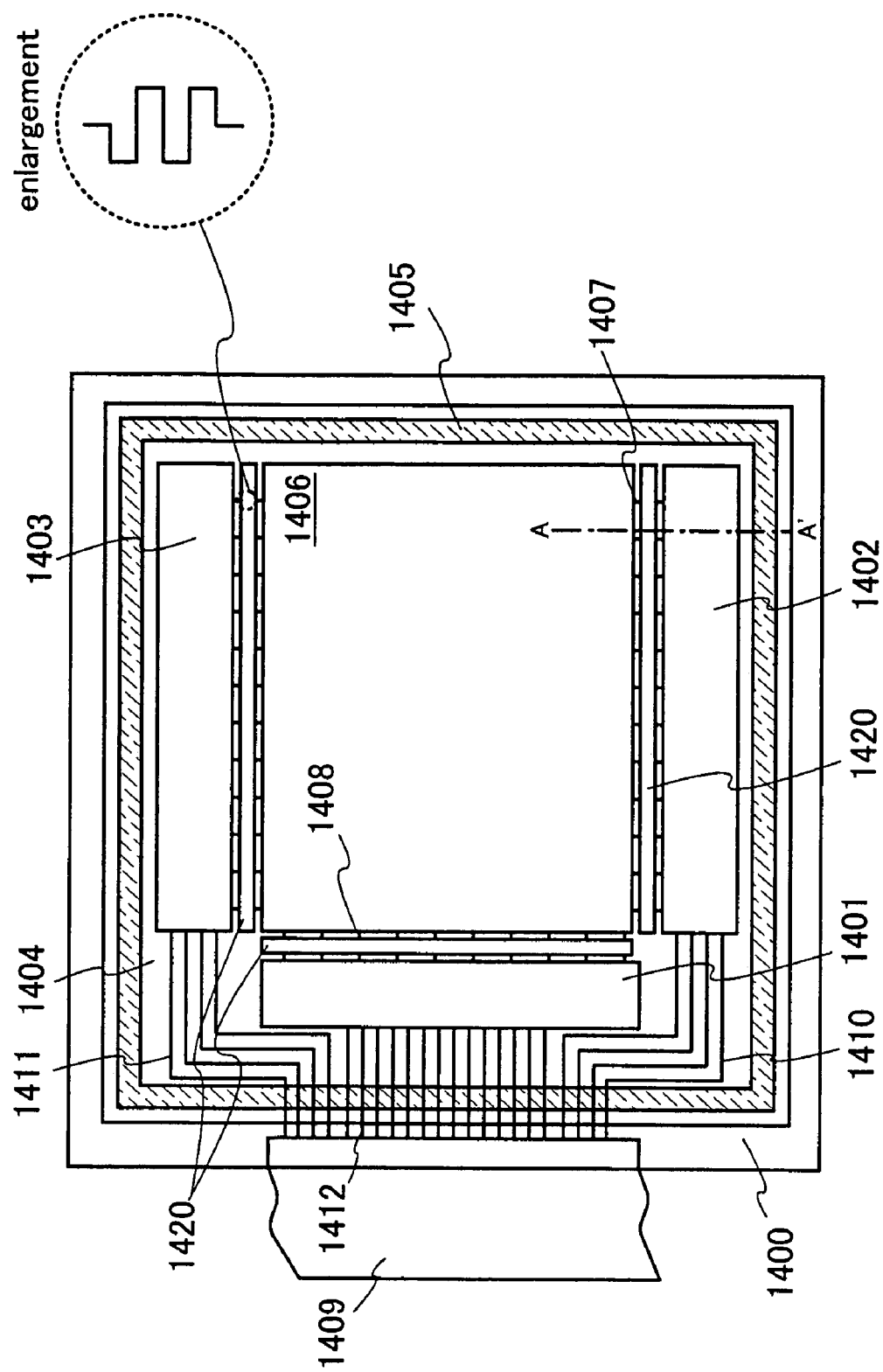
FIG. 15 is a top view of a semiconductor device according to the invention.

FIG. 15 shows a schematic top view of a semiconductor device according to the invention. Numeral reference 1400 denotes an element substrate; 1401, a source line drive circuit; 1402 and 1403, gate line drive circuits; 1404, a sealing substrate; 1405, a sealing material; 1406, a pixel portion; 1407, a scanning line; 1408, a signal line; 1409, FPC; 1410, 1411 and 1412, wirings; and 1420, a protection circuit. FIG. 8 shows a cross-sectional view taken along a line A—A' of FIG. 15. Reference numeral 800 denotes an element substrate; 801, 802 and 803, TFTs; 804, a first electrode; 805, a light emitting layer; 806, a second electrode; 807 a passivation film; 808, a filler; 809, a sealing material; 810, a thermostability planarizing film; 811, a partition; 812, a sealing substrate; 820, an insulating film; and 830, a wiring. The reliability of a semiconductor device according to this embodiment has higher reliability because intrusion of moisture from the outside is prevented since the wiring is formed to cover an end portion in the sealing portion so as to prevent the light emitting element from deteriorating.

This embodiment includes the above-mentioned circuit. However, the invention is not limited thereto, and may be either a passive matrix circuit or an active matrix circuit, and an IC chip may be mounted either by COG or TAB as a peripheral drive circuit, or a peripheral drive circuit may be formed to be integrated. A single gate line drive circuit and a single source line drive circuit may be provided, or plural gate line drive circuits and plural source line drive circuits may be provided.

An enlarged view of the protection circuit 1420 is shown in FIG. 15. The protection circuit of this embodiment can prevent defectiveness of a semiconductor device such as electrostatic discharge damage by making a wiring a rectangle to form a capacitor between wirings to prevent static electricity. The protection circuit is not limited thereto and a TFT, a capacitor, a diode or the like can be appropriately combined to use. Reliability of a semiconductor device is further enhanced by the protection circuit.

The thermostability planarizing film 109, typically, a material in which a skeletal structure is configured by the bond of silicon (Si) and oxygen (O) is used for an interlayer insulating film of a TFT, and the same material is used also for the insulator 119 in a semiconductor device (an active matrix light emitting display device) manufactured in this way. A material containing silicon oxide which is relatively stable is used for a configuration material of a semiconductor device (an active matrix light emitting display device).

Further, an etching residue is reduced to etch an opening with preferable planarity at the time of forming the opening such as a contact hole in a laminated structure constituting a semiconductor device. Hence, a highly reliable semiconductor device can be manufactured by preventing defectiveness such as short circuit or disconnection of wiring or the like.

Embodiment 2

In this embodiment, examples of a top emission type and a dual emission type in the semiconductor device manufactured in the embodiment 1 are described with reference to FIG. 5 and FIG. 9.

Figure 5:
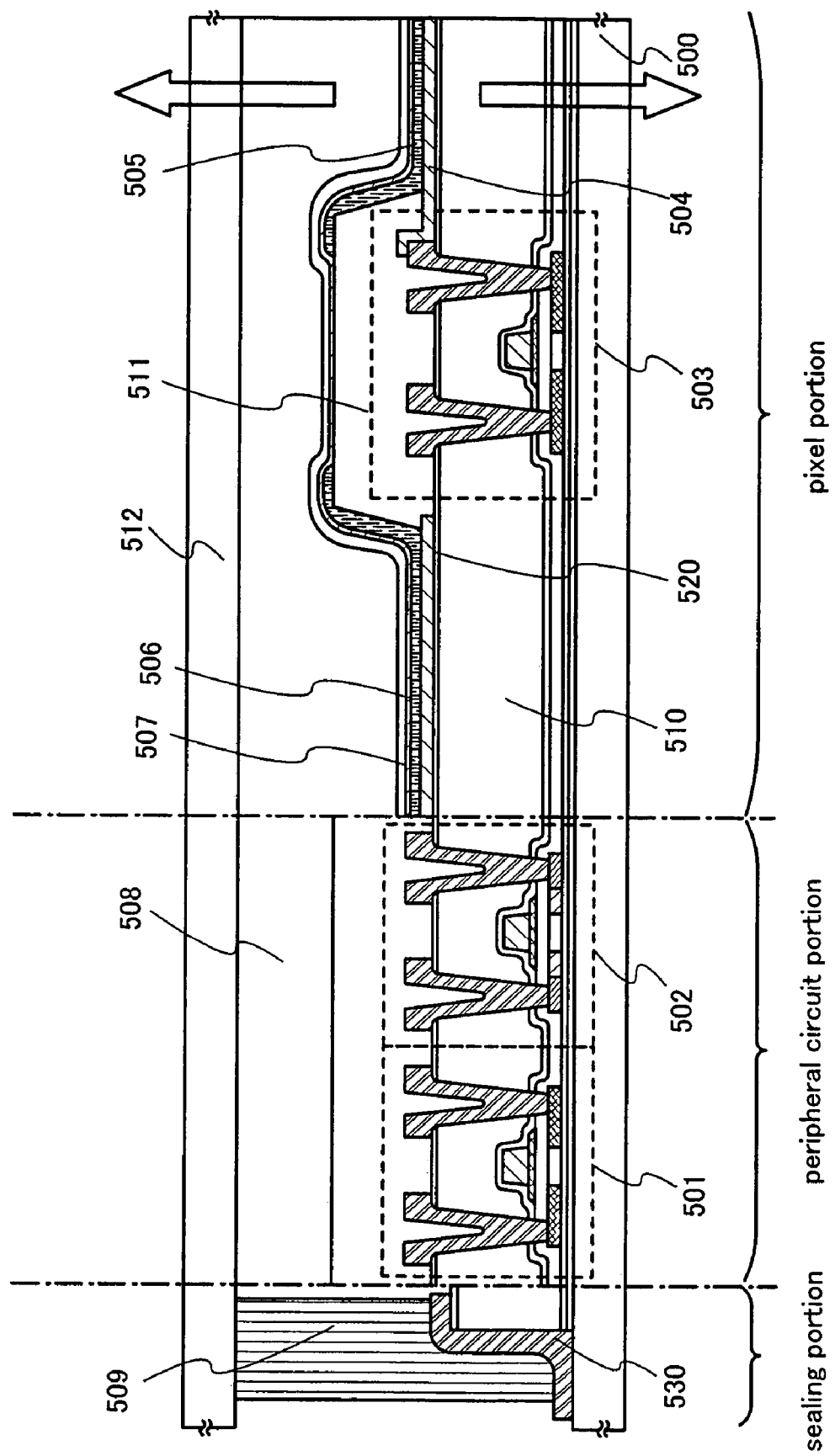
FIG. 5 is a cross-sectional view of a semiconductor device according to the invention.

In FIG. 5, reference numeral 500 denotes a element substrate; 501, 502 and 503, TFTs; 504, a pixel electrode; 505, a light emitting layer; 506, an electrode; 507, a transparent conductive film; 508, a filler; 509, a sealing material; 510, a thermostability planarizing film; 511, a partition; 512 a sealing substrate; 520, an insulating film; and 530, a wiring. A semiconductor device of this embodiment is formed so that a wiring covers an end portion in a sealing portion; thereby having an effect which prevents deterioration of a light emitting element by preventing moisture from coming from the outside. Hence, the semiconductor device of this embodiment has higher reliability.

A semiconductor device shown in FIG. 5 is a dual emission type and has a structure of emitting light both upward and downward in the direction of the arrows. In this embodiment, the pixel electrode 504 is formed from a transparent conductive film by etching to be in a desired shape. As the pixel electrode 504, a material in which zinc oxide (ZnO) of from 2% to 20% is mixed to indium oxide, in addition to ITO, IZO and ITSO, may be used. As the pixel electrode 504, a titanium nitride film or a titanium film may be used in addition to the above-stated transparent conductive film. In this case, the titanium nitride film or the titanium film is formed in a film thickness which transmits light (preferably about from 5 nm to 30 nm) after forming the transparent conductive film. In this embodiment mode, ITSO is used as the pixel electrode 504.

The electrode 506 formed of a conductive film is then formed on the light emitting layer 505. As the electrode 506, a material having a small work function (Al, Ag, Li, Ca, an alloy of these: MgAg, MgIn, AlLi, or a compound of these: $CaF_2$ or CaN) may be used. In this embodiment, a laminated layer of a metal thin film in which a film thickness is thinned so that an emission can be transmitted therethrough (MgAg: a film thickness of 10 nm) as the electrode 506 and ITSO with a film thickness of 100 nm as the transparent conductive film 507 is used. The ITSO film is formed by sputtering by setting gas flow of Ar at 120 sccm; $O_2$, 5 sccm; pressure, 0.25 Pa; and electric power, 3.2 kW by using a target in which silicon oxide ($SiO_2$) of from 1% to 10% is mixed with indium tin oxide. Heat treatment is performed for one hour at 200° C. after forming the ITSO film. As the transparent conductive film 507 (ITO (indium tin oxide), indium oxide—zinc oxide alloy, zinc oxide, tin oxide, indium oxide, or the like) can be used.

When a structure shown in FIG. 5 is adopted, light emitted from the light emitting element transmits through both sides of the pixel electrode 504, and the electrode 506 and the transparent conductive film 507.

Figure 9:
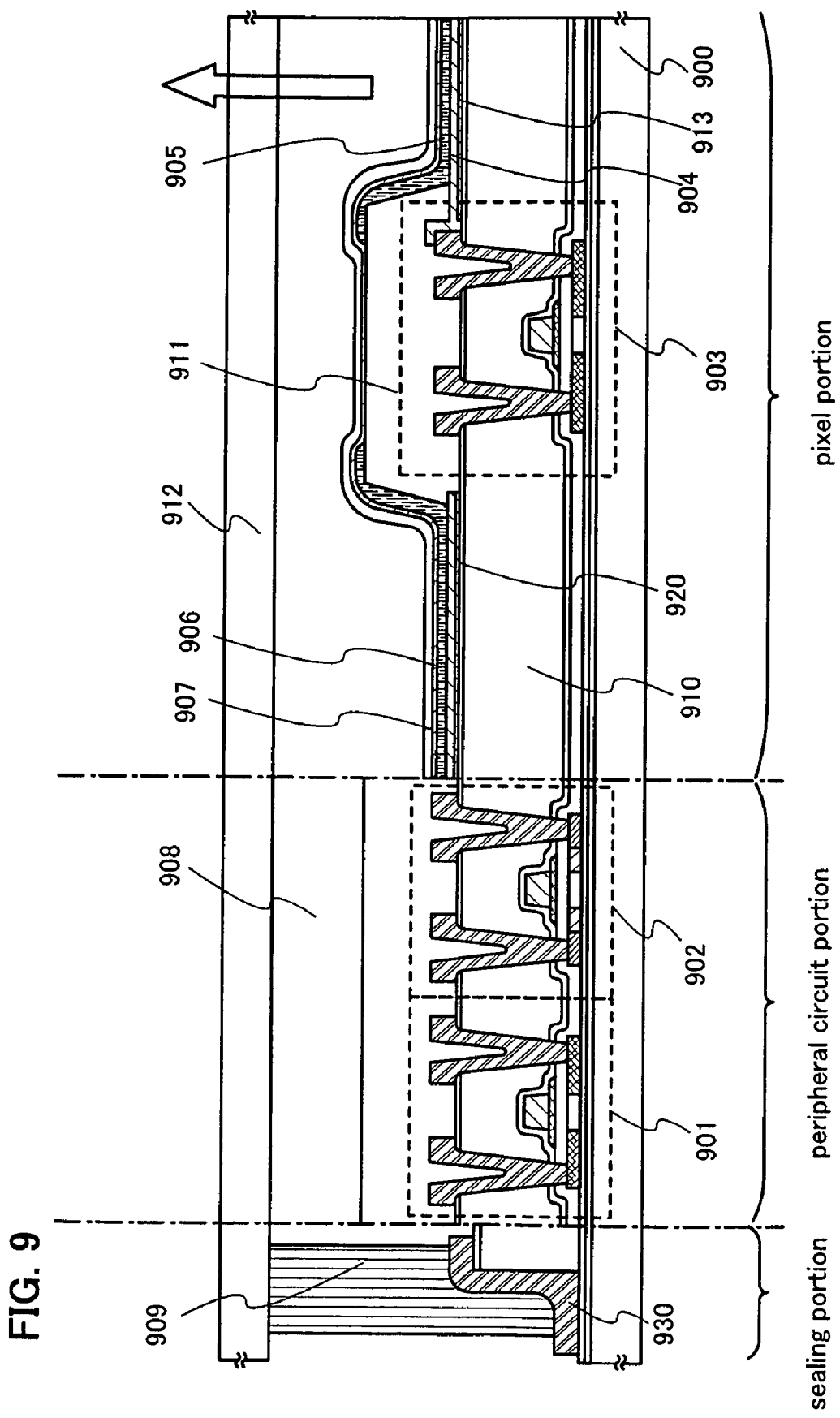
FIG. 9 is a cross-sectional view of a semiconductor device according to the invention.

A semiconductor device shown in FIG. 9 is a one-sided emission type and has a structure to emit light upward in the direction of the arrow. In FIG. 9, reference numeral 900 denotes an element substrate; 901, 902 and 903, TFTs; 913, a metal film having reflectivity; 904, a pixel electrode; 905, a light emitting layer; 906, an electrode; 907, a transparent conductive film; 908, a filler; 909, a sealing material; 910, a thermostability planarizing film; 911, a partition; 912, a sealing substrate; 920, an insulating film; and 930, a wiring. The reliability of a semiconductor device according to this embodiment is higher because intrusion of moisture from the outside is prevented since the wiring is formed to cover an end portion in the sealing portion so as to prevent the light emitting element from deteriorating. In this case, a metal film 913 having reflectivity is formed under the pixel electrode 904 in the semiconductor device of the dual emission type shown in the above-mentioned FIG. 5. A transparent conductive film having reflectivity as the pixel electrode 904 which functions as an anode is formed on the metal film 913. As the metal film 913, Ta, W, Ti, Mo, Al, Cu or the like may be used since the material is only required to have reflectivity. In this embodiment, a TiN film is used.

The electrode 906 formed of a conductive film is provided on the light emitting layer 905. As the electrode 906, a material having a small work function (Al, Ag, Li, Ca, an alloy of these: MgAg, MgIn, AlLi, or a compound of these: $CaF_2$ or CaN) may be used since the electrode 906 is functioned as a cathode. In this embodiment, a laminated layer of a metal thin film in which a film thickness is thinned as the electrode 906 (MgAg: a film thickness of 10 nm) and ITSO film with a film thickness of 110 nm as the transparent conductive film 907 is used so that an emission can be transmitted therethrough. As the transparent conductive film 907 (ITO (indium tin oxide), indium oxide—zinc oxide alloy, zinc oxide, tin oxide, indium oxide, or the like) can be used.

When a structure shown in FIG. 9 is adopted, light emitted from the light emitting element is reflected by the metal film 913 having reflectivity and emitted upward transmitting through the electrode 906, the transparent conductive film 907 and the like.

In the semiconductor device according to the invention, a thermostability planarizing film, typically, a material in which a skeletal structure is configured by the bond of silicon (Si) and oxygen (O) is used as an interlayer insulating film of a TFT. Etching residue is decreased and an opening is formed with preferable planarity by etching at the time of forming the opening such as a contact hole in a laminated structure constituting a semiconductor device. Hence, a highly reliable semiconductor device can be manufactured by preventing defectiveness such as short circuit or disconnection of wiring or the like.

The invention can be combined with each of embodiment mode and embodiment 1.

Embodiment 3

Figure 6:
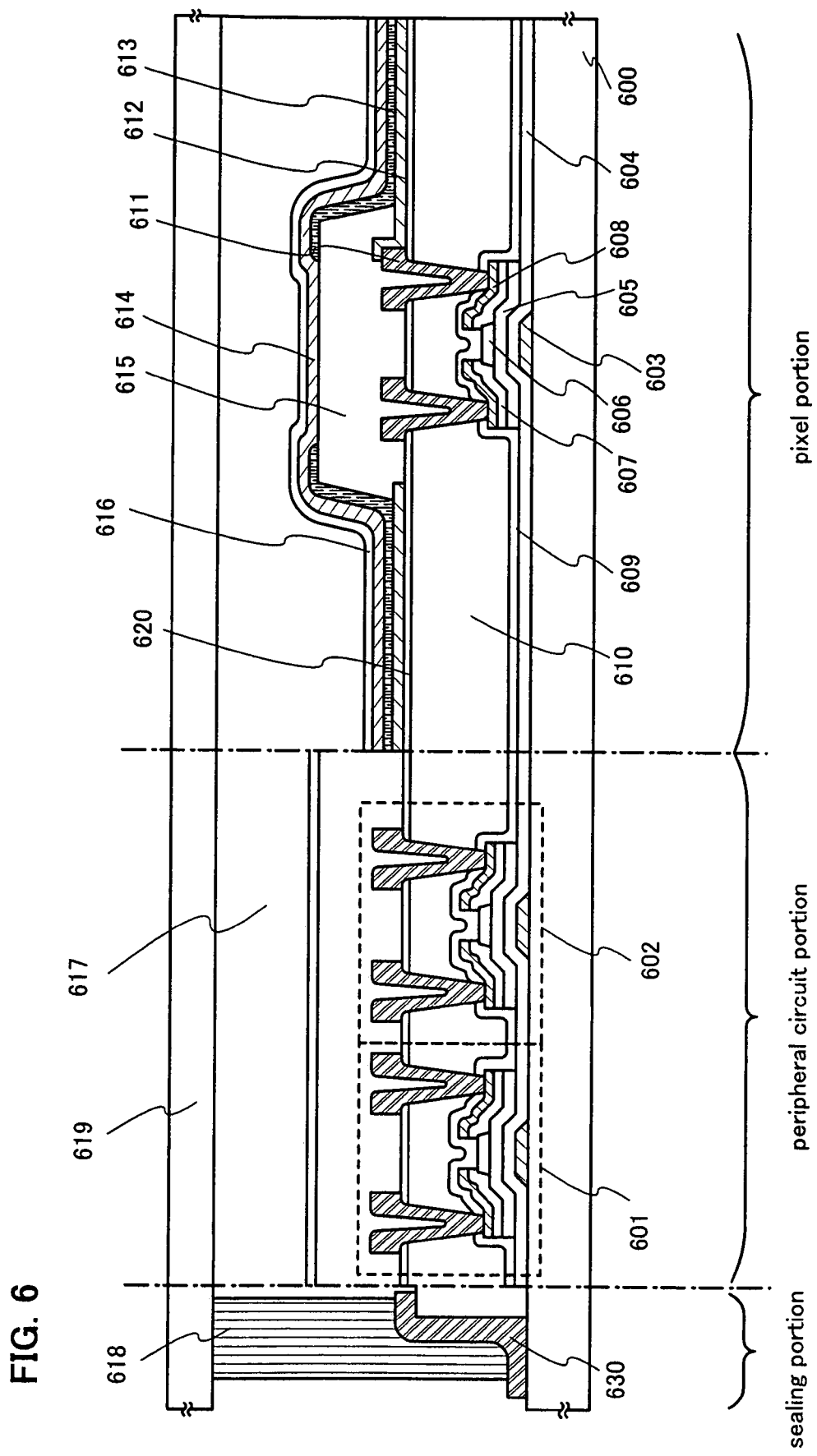
FIG. 6 is a cross-sectional view of a semiconductor device according to the invention.
Figure 7:
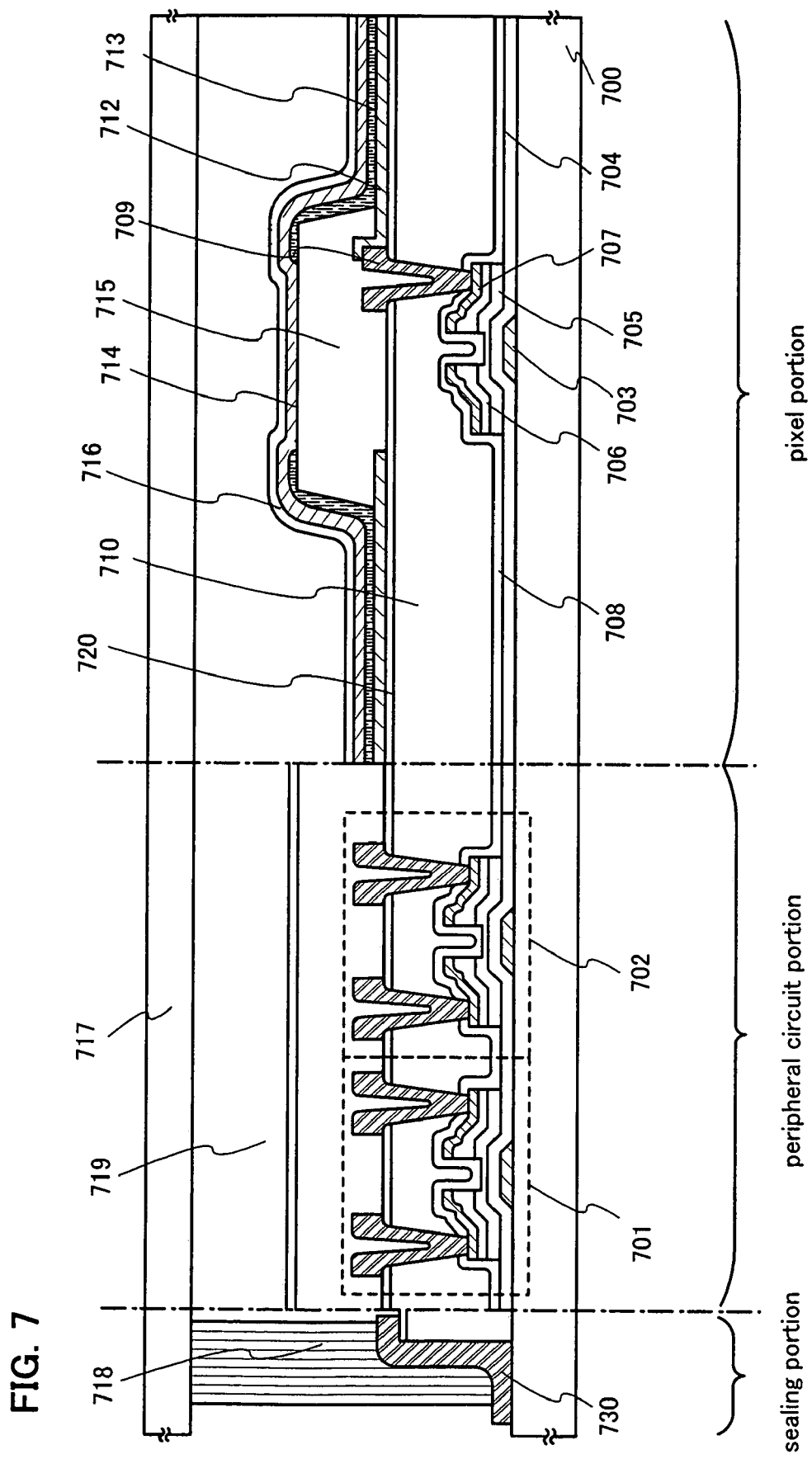
FIG. 7 is a cross-sectional view of a semiconductor device according to the invention.

In this embodiment, an example of an inverse stagger TFT is shown in FIGS. 6 and 7. A portion other than the TFT is the same as FIG. 5 shown in the embodiment mode; therefore, a detailed description is omitted here.

A TFT shown in FIG. 6 is a channel top type. Reference numeral 600 denotes an element substrate; and 601 and 602, TFTs of a drive circuit portion, and a gate insulating film 604, a semiconductor layer 605 formed of an amorphous semiconductor film, an n+layer 607 and a metal layer 608 are laminated over the gate electrode 603, and a channel stopper 606 is formed over a portion which serves as a channel forming region of the semiconductor layer 605. A source electrode or a drain electrode 611 is also formed. Reference numeral 612 denotes a first electrode; 613, a light emitting layer; 614, a second electrode; 616, a passivation film; 619, a filler; 618, a sealing material; 610, a thermostability planarizing film; 615, a partition; 617, a sealing substrate; 620, an insulating film; and 630, a wiring. A semiconductor device of this embodiment is formed so that a wiring covers an end portion in a sealing portion; thereby having an effect which prevents deterioration of a light emitting element by preventing moisture from coming from outside. Hence, the semiconductor device of this embodiment has higher reliability.

A TFT shown in FIG. 7 is a channel etch type. Reference numeral 700 denotes an element substrate; and 701 and 702, TFTs of a drive circuit portion, and a gate insulating film 704, a semiconductor layer 705 formed of an amorphous semiconductor film, an n+layer 706 and a metal layer 707 are laminated over the gate electrode 703, and a portion which serves as a channel forming region of the semiconductor layer 705 is etched to be thin. A source electrode or a drain electrode 709 is also formed. Reference numeral 712 denotes a first electrode; 713, a light emitting layer; 714, a second electrode; 716, a passivation film; 719, a filler; 718, a sealing material; 710, a thermostability planarizing film; 715, a partition; 717, a sealing substrate; 720, an insulating film; and 730, a wiring. A semiconductor device of this embodiment is formed so that a wiring covers an end portion in a sealing portion; thereby having an effect which prevents deterioration of a light emitting element by preventing moisture from coming from outside. Hence, the semiconductor device of this embodiment has higher reliability.

Further, a semi-amorphous semiconductor film which is semiconductor having an intermediate structure of an amorphous structure and a crystal structure (including single crystal and polycrystal), and a tertiary state which is stable as a case of free energy, and including a crystalline region having a short distance order and lattice distortion (also referred to as a microcrystal semiconductor film) can be used in stead of the amorphous semiconductor film. The semi-amorphous semiconductor film is manufactured by performing glow discharging decomposition (plasma CVD) of a silicide gas. As the silicide gas, $SiH_4$, additionally, $Si_2H_6$, $SiH_2Cl_2$, $SiHCl_3$, $SiCl_4$, $SiF_4$, or the like can The silicide gas may be diluted with $H_2$, or $H_2$ and one or more of rare gas elements: He, Ar, Kr, and Ne. Dilution ratio is within the range of from 2 times to 1000 times. Pressure is roughly within the range of from 0.1 Pa to 133 Pa; power frequency, from 1 MHz to 120 MHz, preferably from 13 MHz to 60 MH; and substrate heating temperature, at most 300° C., preferably from 100° C. to 250° C. An atmospheric constitution impurity such as oxygen, nitrogen or carbon as an impurity element within a film is preferably at most $1×10^{20}$ atoms/$cm^{-3}$, in particular, the oxygen concentration is at most $5×10^{19}$ atoms/$cm^3$, preferably, at most $1×10^{19}$ atoms/ cm³. Note that electric field-effect mobility μ of a TFT in using a semi-amorphous semiconductor film as an active layer is from 1 cm²/Vsec to 10 cm²/Vsec.

An amorphous semiconductor film is used for the inverse stagger type TFTs shown in FIGS. 6 and 7. Therefore, a TFT in a pixel portion of this embodiment is an n-channel TFT, and the first electrodes (the pixel electrodes) 612 and 712 function as cathodes, and the second electrodes 614 and 714 function as anodes. In this embodiment, ITSO which is a transparent conductive layer is used for the first electrode and the second electrode, and a structure of the first electrode (ITSO)/an electron injecting layer (BzOS—Li in which Li is added to benzoxazoles (BzOS))/an electron transport layer (Alq)/a light emitting layer (Alq in which quinacridon derivative (DMQd) is doped)/a hole transport layer (4,4'-bis [N-(1-naphthyl)-N-phenyl-amino]-biphenyl (α-NPD))/a hole injecting layer (molybdenum oxide (MoOx))/the second electrode is adopted. A material of the electron injecting layer forming an anode, a cathode and a light emitting layer, the electron transport layer, the light emitting layer, the hole transport layer, the hole injecting layer, and the like is not limited to this embodiment and may be appropriately selected and combined.

Figure 16A:
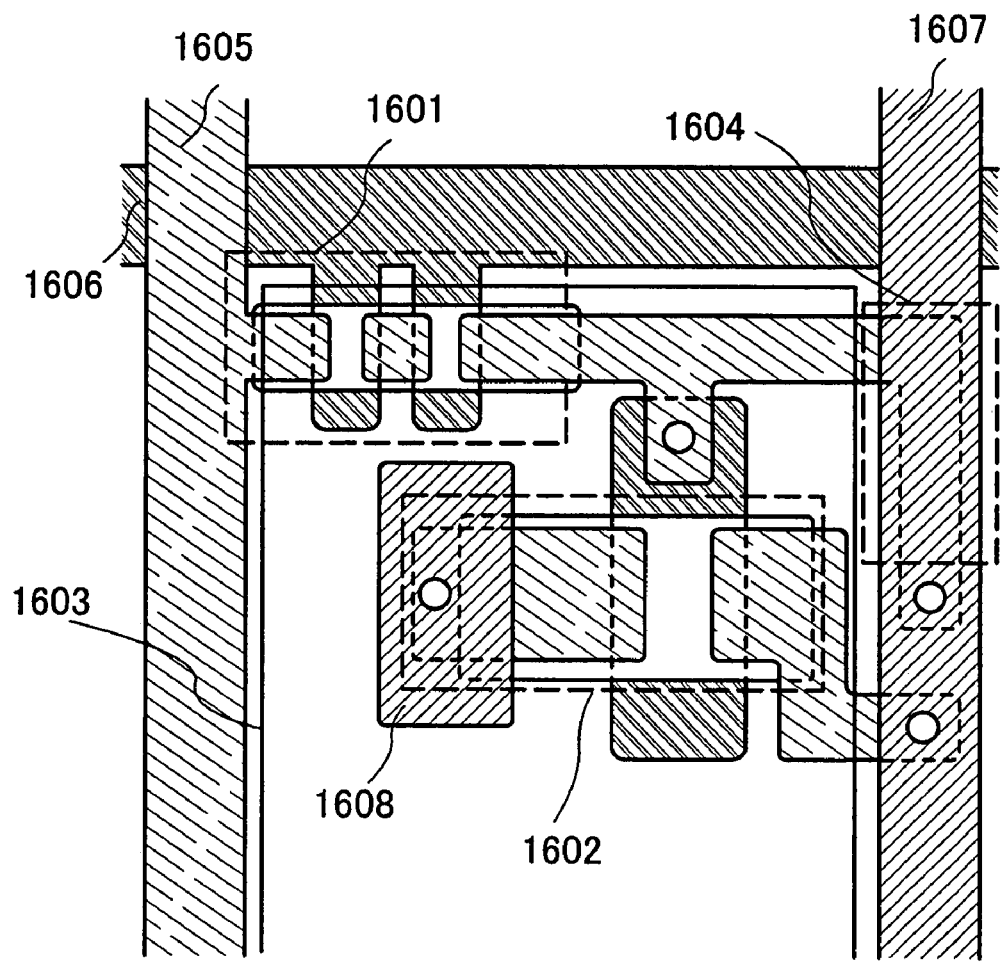
FIGS. 16A and 16B show semiconductor devices according to the invention.
Figure 16B:
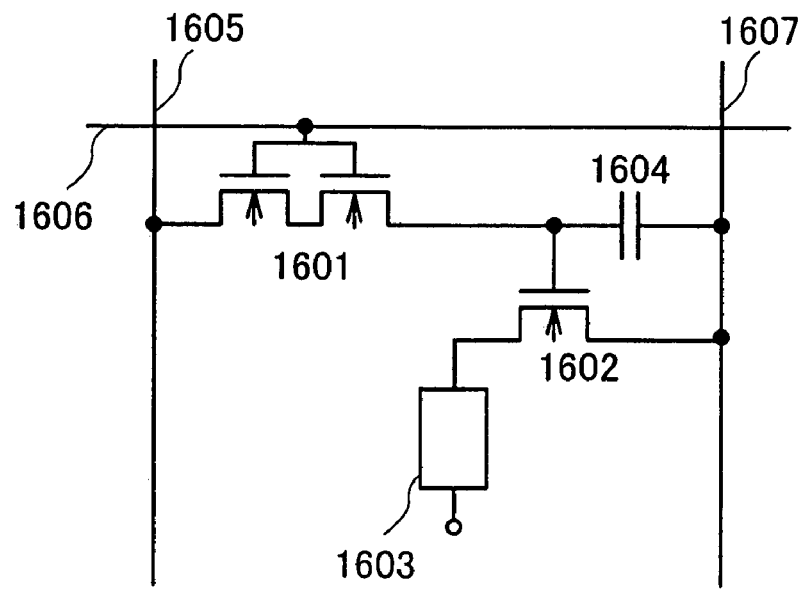

A top view of the pixel portion of a semiconductor device of this embodiment is shown in FIG. 16A, a circuit diagram is shown in FIG. 16B. Reference numeral 1601 and 1602 denote TFTs; 1603, a light emitting element; 1604, a capacity; 1605, a source line; 1606, a gate line; 1607, a power line; and 1608, a connection electrode being connected to the pixel electrode constituting 1603.

In the semiconductor device according to the invention, a thermostability planarizing film, typically, a material in which a skeletal structure is configured by the bond of silicon (Si) and oxygen (O) is used as an interlayer insulating film of a TFT. An etching residue is decreased and an opening is etched with preferable planarity at the time of forming the opening such as a contact hole in a laminated structure constituting a semiconductor device. Hence, a highly reliable semiconductor device can be manufactured by preventing defectiveness such as short circuit or disconnection of wiring or the like.

This embodiment can be freely combined with each of the embodiment mode, embodiment 1 and embodiment 2.

Embodiment 4

Various types of semiconductor devices can be manufactured according to the present invention. In other words, the invention is applicable to various electronic devices in which these semiconductor devices are incorporated in a display portion.

Examples of these kinds of electronic devices are as follows: a video camera; a digital camera; a projector; a head mounted display (a goggle type display); a car navigating system; a mobile stereo; a personal computer; a game machine; a personal digital assistant (a mobile computer, a cellular phone, an electronic book, or the like); and an image reproducing device including a recording medium (specifically, a device capable of reproducing data in a recording medium such as a Digital Versatile Disk (DVD) and having a display that can display the image of the data); and the like. FIGS. 10A to 10E show these examples.

Figure 10A:
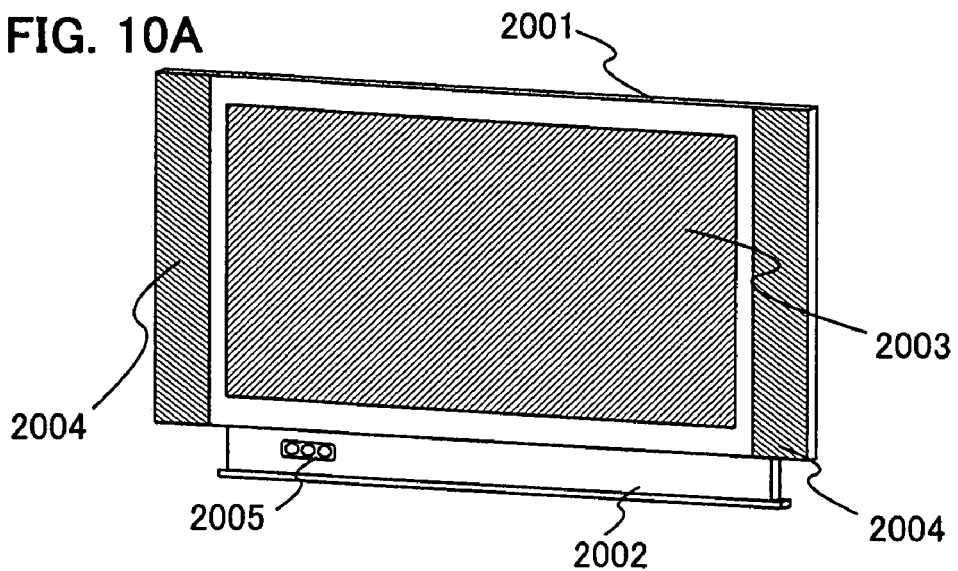
FIGS. 10A to 10E show examples of semiconductor devices according to the invention.

FIG. 10A illustrates a semiconductor device having a large-sized display portion of for example, from 20 inches to 80 inches, which includes a casing 2001, a support base 2002, a display portion 2003, speaker portions 2004, video input terminals 2005 and the like. The invention is applied to manufacturing of display portion 2003. It is preferable to manufacture this kind of large-sized semiconductor device by using a large-sized substrate having a corner of meter size such as the so-called fifth generation (1000×1200 mm), the sixth generation (1400×1600 mm) or the seventh generation (1500×1800 mm) with from productivity and cost point of view. According to the invention, highly reliable semiconductor device can be manufactured even if a number of TFTs or electronic components are used with the use of these large-sized substrates.

Figure 10B:
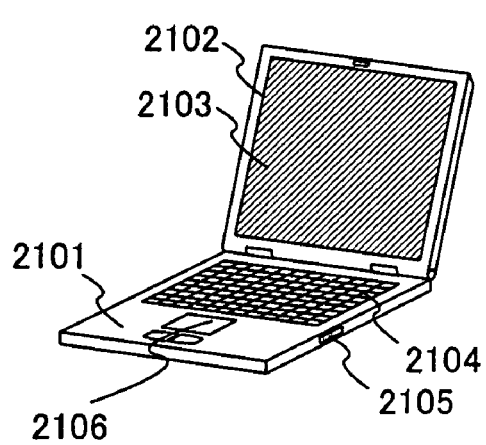

FIG. 10B illustrates a lap-top personal computer, which includes a main body 2101, a casing 2102, a display portion 2103, a keyboard 2104, an external connection port 2105, a pointing mouse 2106 and the like. The invention is applied to manufacturing the display portion 2103. According to the invention, an image with high reliability and high-resolution can be displayed even if a lap-top personal computer is downsized and a wiring and the like are refined.

Figure 10C:
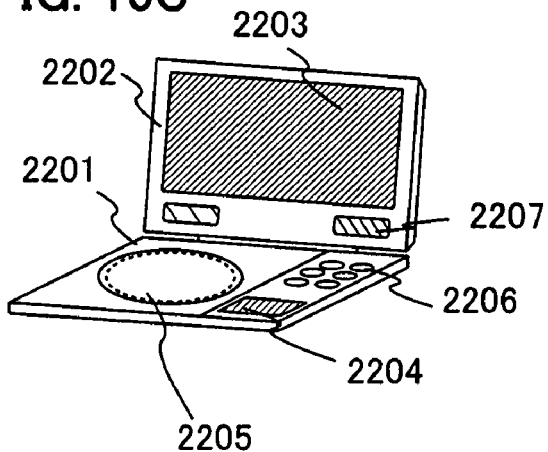

FIG. 10C illustrates an image reproduction device including a recording medium (specifically, a DVD reproduction device), which includes a main body 2101, a casing 2202, a display portion A 2203, a display portion B 2204, a recording medium (a DVD or the like) reading portion 2205, operation keys 2206, speaker portions 2207 and the like. The display portion A 2203 is used mainly for displaying image information, while the display portion B 2204 is used mainly for displaying character information. The invention is applied to manufacturing these display portions A and B, 2203 and 2204. According to the invention, an image with high reliability and high-resolution can be displayed even if an image reproduction device is downsized and a wiring and the like are refined.

Figure 10D:
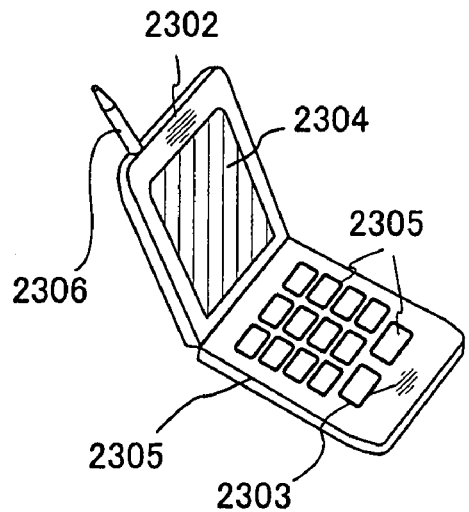

FIG. 10D illustrates a cellular phone which includes a main body 2301, an audio output portion 2302, an audio input portion 2303, a display portion 2304, operation switches 2305, an antenna 2306 and the like. By applying a semiconductor device manufactured by the invention to the display portion 2304, an image with high reliability and high-resolution can be displayed even if a cellular phone is downsized and a wiring and the like are refined.

Figure 10E:
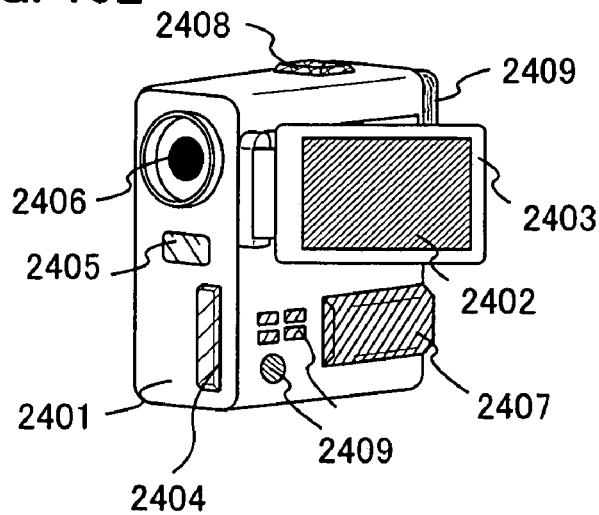

FIG. 10E illustrates a video camera which includes a main body 2401, a display portion 2402, a casing 2403, an external connection port 2404, a remote control receiver 2405, an image reception portion 2406, a battery 2407, an audio input portion 2408, operation switches 2409 and the like. The present invention is applicable to the displayportion 2402. By applying a semiconductor device manufactured according to the invention to the display portion 2402, an image with high reliability and high-resolution can be displayed even if a video camera is downsized and a wiring and the like are refined.

Figure 11:
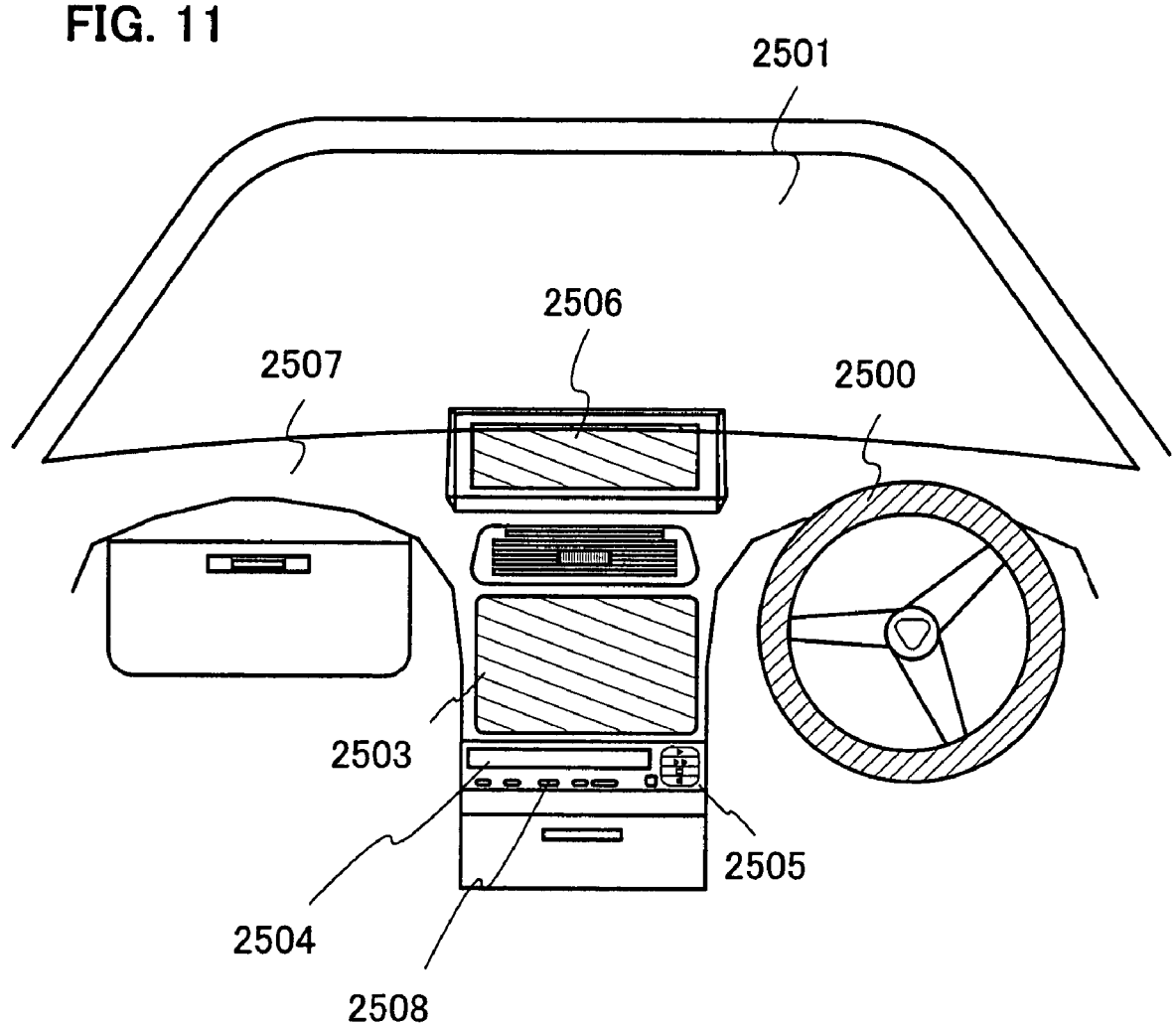
FIG. 11 shows an example of a semiconductor device according to the invention.

FIG. 11 shows an example of mounting the display portion on an automobile. Here, an automobile is used as a typical example of a vehicle, but the invention is not particularly limited thereto. The invention is applicable to an aircraft, a train, an electric train, and the like. As for a semiconductor device mounted particularly on an automobile, emphasis is put on having high reliability even in a severe environment (inside of an automobile which is subject to high temperatures and high humidity). In addition, a semiconductor device mounted on an automobile is used in a restricted space. Hence, equipment constituting the semiconductor device is also manufactured downsized; therefore, a wiring and the like are also formed thickly.

FIG. 11 shows the vicinity of a drive's seat in an automobile. A dashboard 2507 is provided with audio reproducing devices, specifically a car audio system and a car navigating system. A main body 2505 of the car audio system includes a display portion 2504 and operation switches 2508. By applying the invention to the display portion 2503, a car audio system with high reliability can be completed.

By applying the invention further to the display portion 2503 of the car navigating system, and a display portion 2506 displaying an air condition state in an automobile, a car navigation system with high reliability can be completed.

Further, an on-board car audio system and a car navigation system are described in this embodiment; however, the invention may be applied to other vehicle indicators and to stationary audio equipment and navigating systems.

As described above, the application range of the invention is quite wide, and the invention is applicable to electronic devices in all fields.

The invention can be freely combined with each of the embodiment mode or embodiment 1 through 3.

Embodiment 5

In the embodiment 1, an example of using He or Ar is shown as an inert gas added to an etching gas in forming a contact hole of a semiconductor device. In this embodiment, an example of using Kr or Xe as an inert gas is described with reference to FIGS. 18A and 18B and FIGS. 19A and 19B.

As well as the embodiment 1, a conductive layer which serves as a base film, a semiconductor film, a gate insulating film, a gate electrode is formed over a substrate. An interlayer insulating layer formed of three layers: an insulating film including silicon nitride oxide (SiNO), a thermostability planarizing film in which a skeletal structure is configured by the bond of silicon (Si) and oxygen (O), and an insulating film including silicon nitride which functions as a passivation film is formed so as to cover the gate insulating film and the gate electrode.

An opening which serves as a contact hole is formed in the interlayer insulating layer and the gate insulating film so that a wiring formed over the interlayer insulating layer is electrically connected to the semiconductor film. In this embodiment, two-step etching of the interlayer insulating layer and the gate insulating film is performed using two kinds of etching gases.

As well as the example in FIG. 4 which is shown as a comparative example in the embodiment 1, the interlayer insulating layer is etched by setting flow of $CF_4$ at 50 sccm; $O_2$, 50 sccm; He, 35 sccm; RF power, 500 W; and pressure, 300 mTorr (about 40 Pa). Subsequently, a residue of the interlayer insulating film and the gate insulating film are etched with an etching gas in which an inert gas of Kr or Xe is added so that the semiconductor layer is exposed.

Figure 18A:
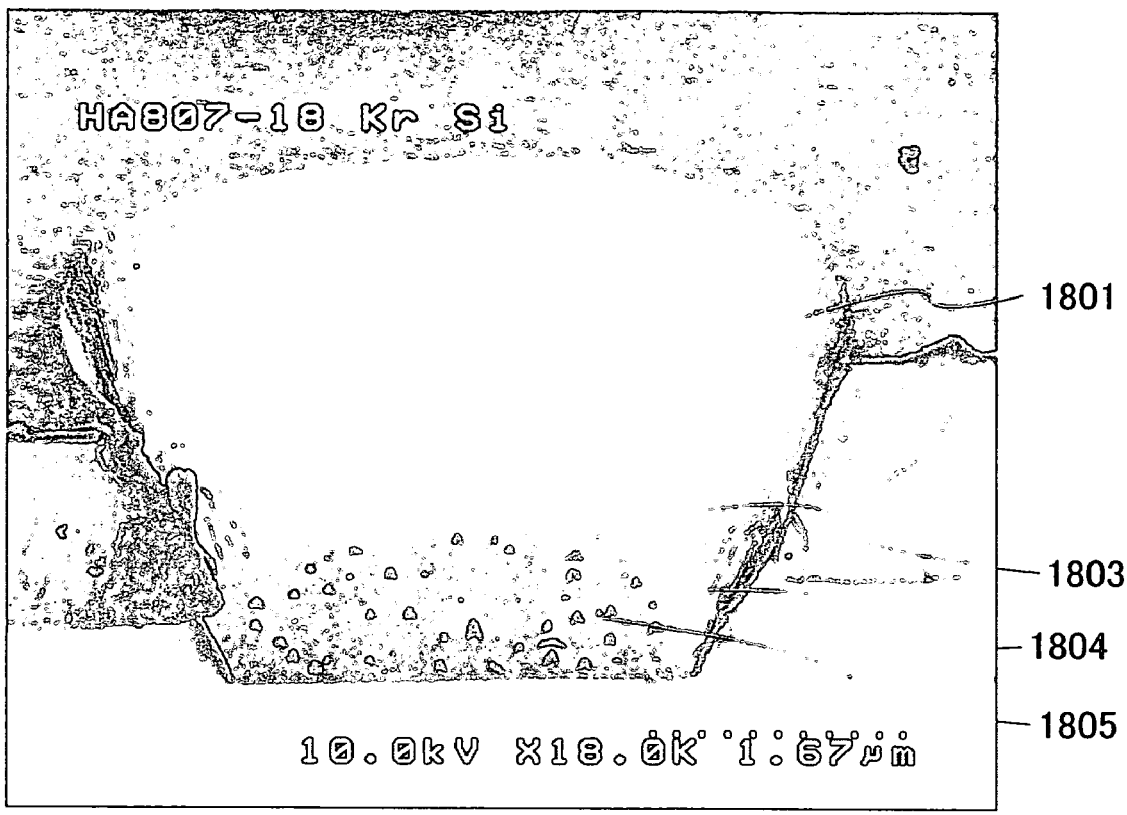
FIGS. 18A and 18B show openings according to the invention.
Figure 18B:
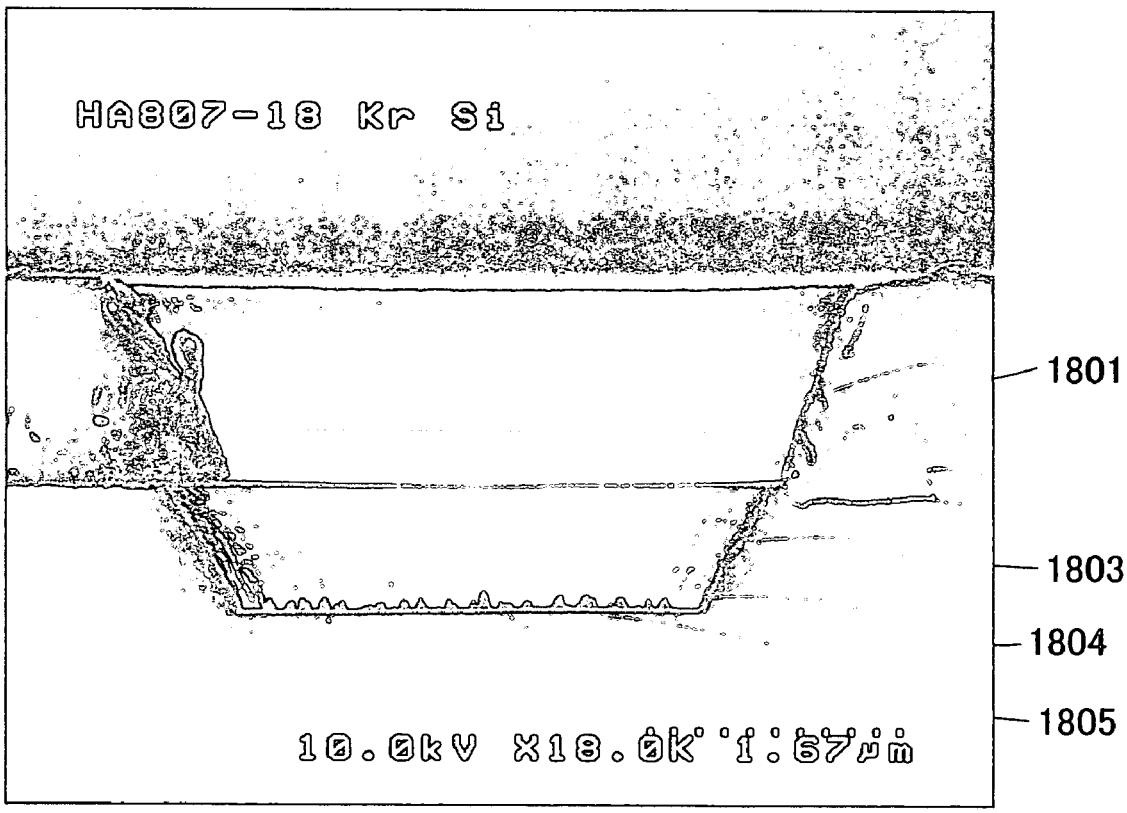

An example where Kr is used as an inert gas is shown in FIGS. 18A and 18B. ICP etching is performed using 48 sccm of $CHF_3$ and 152 sccm of Kr, and setting electric power applied to a coil-shaped electrode at 50 W; electric power applied to an electrode on a substrate side, 450 W; and pressure, 5.5 Pa. FIG. 18A shows a perspective view of an opening (a contact hole) formed in a semiconductor device, and FIG. 18B shows a cross-sectional view which is a SEM photograph observed with the use of Scanning Electron Microscope: SEM. In FIGS. 18A and 18B, a gate insulating film 1804, an interlayer insulating layer 1803 are formed over a semiconductor film 1805. The interlayer insulating layer 1803 is formed of three layers: a silicon nitride oxide film, a thermostability planarizing film and a silicon nitride film from the side of the gate insulating film 1804. In FIGS. 18A and 18B, an outgoing line 1803 illustrates a portion of the thermostability planarizing film. Etching is performed by using a resist 1801 as a mask, and the opening which reaches the semiconductor film 1805 is formed. The formed contact hole is formed to have a tapered shape, and the diameter of the opening becomes smaller toward a bottom portion. A residue is hardly observed on the exposed semiconductor film 1805 as shown in FIGS. 18A and 18B; therefore, it is understood that the etching is performed to have a preferable shape.

Figure 19A:
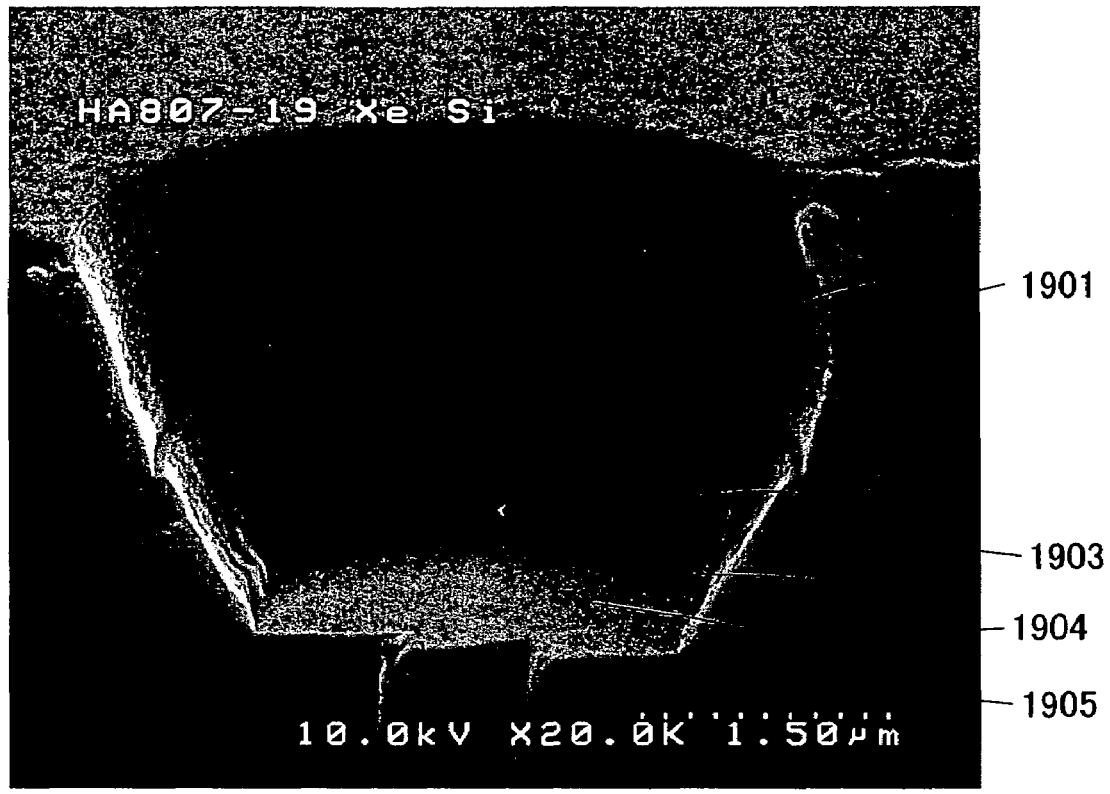
FIGS. 19A and 19B show openings according to the invention.
Figure 19B:
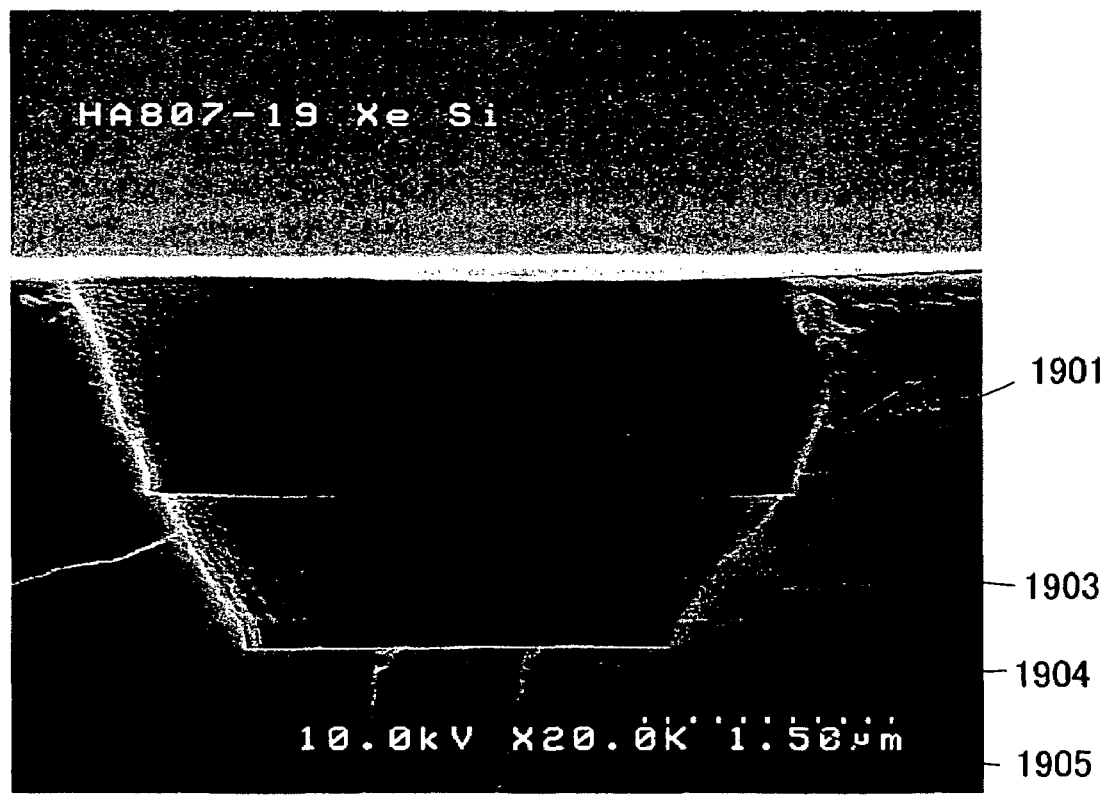

An example where Xe is used as an inert gas is shown in FIGS. 18A and 18B. ICP etching is performed using 48 sccm of $CHF_3$ and 152 sccm of Xe, and setting electric power applied to a coil-shaped electrode at 50 W; electric power applied to an electrode on a substrate side, 450 W; and pressure, 5.5 Pa. FIG. 19A shows a perspective view of an opening (a contact hole) formed in a semiconductor device, and FIG. 19B shows a cross-sectional view which is a SEM photograph observed with the use of Scanning Electron Microscope (SEM). In FIGS. 19A and 19B, a gate insulating film 1904, an interlayer insulating layer 1903 are formed over a semiconductor film 1905. The interlayer insulating layer 1903 is formed of three layers: a silicon nitride oxide film, a thermostability planarizing film and a silicon nitride film from the side of the gate insulating film 1904. In FIGS. 19A and 19B, an outgoing line 1903 illustrates a portion of the thermostability planarizing film. Etching is performed by using a resist 1901 as a mask, and the opening which reaches the semiconductor film 1905 is formed. The formed contact hole is formed to have a tapered shape, and the diameter of the opening becomes smaller toward a bottom portion. A residue is hardly observed on the exposed semiconductor film 1905 as shown in FIGS. 19A and 19B; therefore, it is understood that the etching is performed to have a preferable shape.

As the above-mentioned result, it is confirmed that an opening can be formed with preferable planarity even if Kr or Xe is used as an inert gas added to an etching gas. Hence, a highly reliable semiconductor device can be manufactured by preventing short circuit, disconnection, and the like of a wiring and the like.

Embodiment 6

A case in which the semiconductor device of the invention is applicable to a system LSI is described with reference to FIG. 20.

The system LSI is an LSI constituting a system which is incorporated inside of a device assuming a particular usage, and performs the control of the device or data processing. There is a wide variety of usage, and examples include a cellular phone, a PDA, a DSC, a television, a printer, a facsimile, a game machine, a car navigation system, a DVD player and the like.

In an LSI, in electrically connecting a wiring or an electrode through an interlayer insulating film, etching according to the invention can be employed. An opening which serves as a contact hole having preferable planarity can be formed by forming an interlayer insulating layer and performing etching as shown in the invention.

Figure 20:
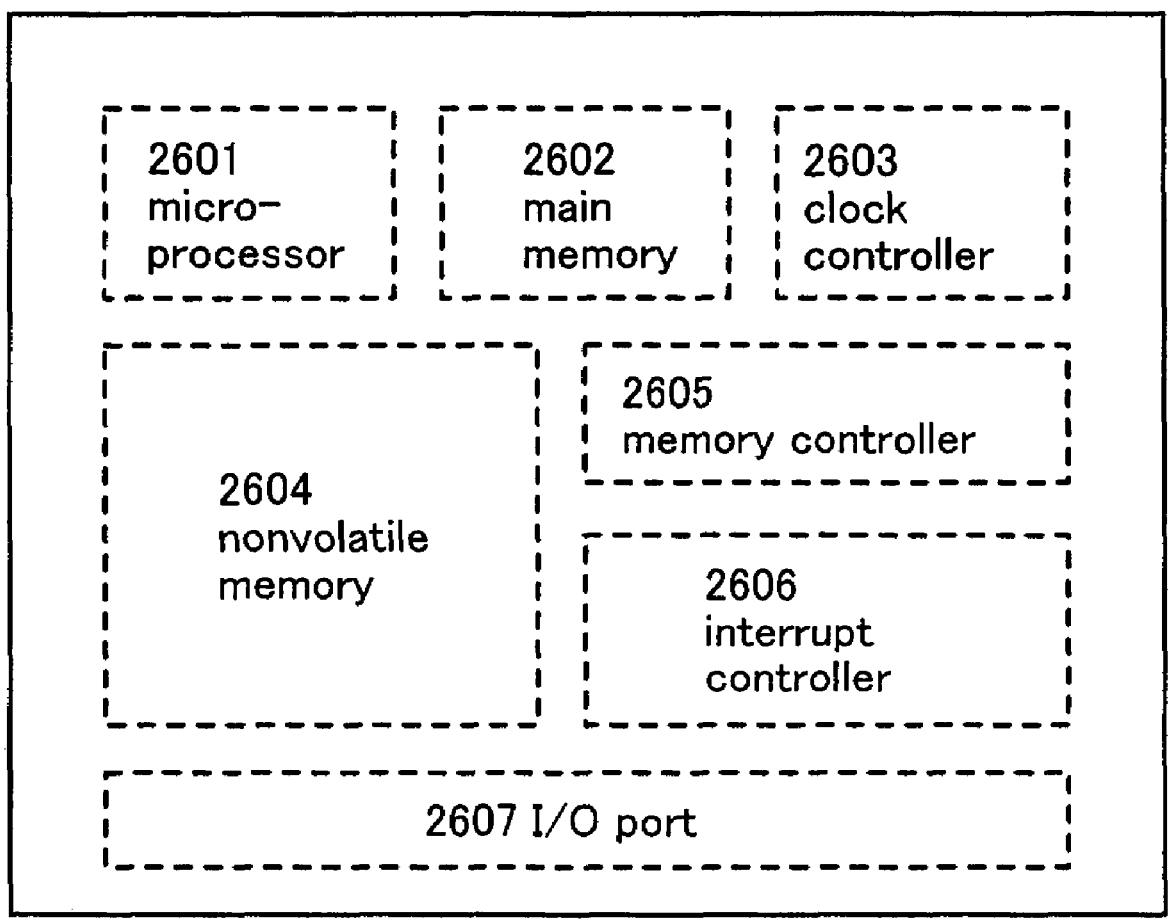
FIG. 20 is a block diagram showing a constitution of a semiconductor device according to the invention.

FIG. 20 illustrates an example of a system LSI. A system LSI typically includes a microprocessor 2601, a nonvolatile memory 2604, a clock controller 2603, a main memory 2602, a memory controller 2605, an interrupt controller 2606, an I/O port 2607 and the like. The system LSI illustrated in FIG. 20 is a simplified example, and naturally, a wide variety of circuits can be designed according to the usage of an actual system LSI.

It is possible to manufacture various circuits over a single substrate since a transistor and a memory transistor constituting the microprocessor 2601, the clock controller 2603, the main memory 2602, the memory controller 2605, the interrupt controller 2606, the I/O port 2607 can be manufactured the same by using the same step.

This embodiment can be freely combined with each of the embodiment mode, embodiment 1 through 5.

What is claimed is:

1. A method for manufacturing a semiconductor device, comprising the steps of:
   forming a second interlayer insulating film;
   forming a first interlayer insulating film over the second interlayer insulating film;
   forming an opening which reaches the second interlayer insulating film by selectively removing the first interlayer insulating film using a first gas; and
   forming a contact hole by selectively removing the second interlayer insulating film in the opening with using a second gas,
   wherein at least one of the first gas and the second gas comprises Ar, and
   wherein the second interlayer insulating film is a gate insulating film.

2. A method for manufacturing a semiconductor device according to claim 1, wherein the first interlayer insulating film is a thermostability planarizing film containing silicon oxide.

3. A method for manufacturing a semiconductor device, comprising the steps of:
   forming a second interlayer insulating film;
   forming a first interlayer insulating film over the second interlayer insulating film;
   forming an opening which reaches the second interlayer insulating film by selectively removing the first interlayer insulating film using a first gas; and
   forming a contact hole by selectively removing the second interlayer insulating film in the opening with using a second gas,
   wherein at least one of the first gas and the second gas comprises Ar, and wherein a flow of Ar is 26% or more and 50% or less of a total flow of the first gas.

4. A method for manufacturing a semiconductor device, comprising the steps of:
   forming a second interlayer insulating film;
   forming a first interlayer insulating film over the second interlayer insulating film;
   forming an opening which reaches the second interlayer insulating film by selectively removing the first interlayer insulating film using a first gas; and
   forming a contact hole by selectively removing the second interlayer insulating film in the opening with using a second gas,
   wherein at least one of the first gas and the second gas comprises Ar, and wherein a flow of Ar is 60% or more and 85% or less of a total flow of the second gas.

5. A method for manufacturing a semiconductor device, comprising the steps of:
   forming a thin film transistor having a semiconductor layer having a source region, a drain region and a channel forming region therebetween, a gate insulating film, and a gate electrode over a substrate having an insulating surface;
   forming a thermostability planarizing film containing silicon oxide over the thin film transistor;
   forming an opening over the source region and the drain region which reaches the gate insulating film by selectively removing the thermostability planarizing film using a first gas containing an inert gas; and
   forming a contact hole which reaches the source region and the drain region by selectively removing the gate insulating film using a second gas.

6. A method for manufacturing a semiconductor device, comprising the steps of:
   forming a thin film transistor having a semiconductor layer having a source region, a drain region and a channel forming region therebetween, a gate insulating film, and a gate electrode over a substrate having an insulating surface;
   forming a first insulating film over the thin film transistor;
   forming a thermostability planarizing film containing silicon oxide over the thin film transistor;
   forming a second insulating film over the thermostability planarizing film;
   forming an opening over the source region and the drain region by selectively removing the first insulating film, the thermostability planarizing film and the second insulating film using a first gas containing an inert gas; and
   forming a contact hole which reaches the source region and the drain region by selectively removing the gate insulating film using a second gas.

7. A method for manufacturing a semiconductor device, comprising the steps of:
   forming a thin film transistor having a semiconductor layer having a source region, a drain region and a channel forming region therebetween, a gate insulating film, and a gate electrode over a substrate having an insulating surface;
   forming a thermostability planarizing film containing silicon oxide over the thin film transistor;
   forming an opening over the source region and the drain region which reaches the pate insulating film by selectively removing the thermostability planarizing film using a first gas; and
   forming a contact hole which reaches the source region and the drain region by selectively removing the gate insulating film using a second gas containing an inert gas.

8. A method for manufacturing a semiconductor device, comprising the steps of:
   forming a thin film transistor having a semiconductor layer having a source region, a drain region and a channel forming region therebetween, a gate insulating film, and a gate electrode over a first substrate having an insulating surface;
   forming a first insulating film over the thin film transistor;
   forming a thermostability planarizing film containing silicon oxide over the thin film transistor;
   forming a second insulating film over the thermostability planarizing film;
   forming an opening over the source region and the drain region by selectively removing the first insulating film, the thermostability planarizing film and the second insulating film using a first gas; and
   forming a contact hole which reaches the source region and the drain region by selectively removing the gate insulating film using a second gas containing an inert gas.

9. A method for manufacturing a semiconductor device, comprising the steps of:
   forming a thin film transistor having a semiconductor layer having a source region, a drain region and a channel forming region therebetween, a gate insulating film, and a gate electrode over a first substrate having an insulating surface;

forming a thermostability planarizing film containing silicon oxide over the thin film transistor;

forming an opening over the source region and the drain region which reaches the gate insulating film by selectively removing the thermostability planarizing film using a first gas containing an inert gas; and forming a contact hole which reaches the source region and the drain region by selectively removing the gate insulating film using a second gas containing an inert gas.

10. A method for manufacturing a semiconductor device, comprising the steps of:

forming a thin film transistor having a semiconductor layer having a source region, a drain region and a channel forming region therebetween, a gate insulating film, and a gate electrode over a first substrate having an insulating surface;

forming a first insulating film over the thin film transistor;

forming a thermostability planarizing film containing silicon oxide over the thin film transistor;

forming a second insulating film over the thermostability planarizing film;

forming an opening over the source region and the drain region by selectively removing the first insulating film, the thermostability planarizing film and the second insulating film using a first gas containing an inert gas; and forming a contact hole which reaches the source region and the drain region by selectively removing the gate insulating film using a second gas containing an inert gas.

11. A method for manufacturing a semiconductor device according to claim 6, wherein the first insulating film and the second insulating film are nitride films, and the gate insulating film is an oxide film.

12. A method for manufacturing a semiconductor device according to claim 8, wherein the first insulating film and the second insulating film are nitride films, and the gate insulating film is an oxide film.

13. A method for manufacturing a semiconductor device according to claim 10, wherein the first insulating film and the second insulating film are nitride films, and the gate insulating film is an oxide film.

14. A method for manufacturing a semiconductor device according to claim 5, wherein the inert gas is one or more of Ar, Kr and Xe.

15. A method for manufacturing a semiconductor device according to claim 6, wherein the inert gas is one or more of Ar, Kr and Xe.

16. A method for manufacturing a semiconductor device according to claim 7, wherein the inert gas is one or more of Ar, Kr and Xe.

17. A method for manufacturing a semiconductor device according to claim 8, wherein the inert gas is one or more of Ar, Kr and Xe.

18. A method for manufacturing a semiconductor device according to claim 9, wherein the inert gas is one or more of Ar, Kr and Xe.

19. A method for manufacturing a semiconductor device according to claim 10, wherein the inert gas is one or more of Ar, Kr and Xe.

20. A method for manufacturing a semiconductor device according to claim 5, wherein a flow of the inert gas is 26% or more and 50% or less of a total flow of the first gas.

21. A method for manufacturing a semiconductor device according to claim 6, wherein a flow of the inert gas is 26% or more and 50% or less of a total flow of the first gas.

22. A method for manufacturing a semiconductor device according to claim 9, wherein a flow of the inert gas is 26% or more and 50% or less of a total flow of the first gas.

23. A method for manufacturing a semiconductor device according to claim 10, wherein a flow of the inert gas is 26% or more and 50% or less of a total flow of the first gas.

24. A method for manufacturing a semiconductor device according to claim 7, wherein a flow of the inert gas is 60% or more and 85% or less of a total flow of the second gas.

25. A method for manufacturing a semiconductor device according to claim 8, wherein a flow of the inert gas is 60% or more and 85% or less of a total flow of the second gas.

26. A method for manufacturing a semiconductor device according to claim 9, wherein a flow of the inert gas is 60% or more and 85% or less of a total flow of the second gas.

27. A method for manufacturing a semiconductor device according to claim 10, wherein a flow of the inert gas is 60% or more and 85% or less of a total flow of the second gas.

28. A method for manufacturing a semiconductor device according to claim 5, wherein the first gas comprises $CF_4$, $O_2$, He and Ar.

29. A method for manufacturing a semiconductor device according to claim 6, wherein the first gas comprises $CF_4$, $O_2$, He and Ar.

30. A method for manufacturing a semiconductor device according to claim 9, wherein the first gas comprises $CF_4$, $O_2$, He and Ar.

31. A method for manufacturing a semiconductor device according to claim 10, wherein the first gas comprises $CF_4$, $O_2$, He and Ar.

32. A method for manufacturing a semiconductor device according to claim 7, wherein the second gas contains $CHF_3$ and Ar.

33. A method for manufacturing a semiconductor device according to claim 8, wherein the second gas contains $CHF_3$ and Ar.

34. A method for manufacturing a semiconductor device according to claim 9, wherein the second gas contains $CHF_3$ and Ar.

35. A method for manufacturing a semiconductor device according to claim 10, wherein the second gas contains $CHF_3$ and Ar.

* * * * *